US008053772B2

(12) United States Patent
Mitzi et al.

(10) Patent No.: US 8,053,772 B2
(45) Date of Patent: Nov. 8, 2011

(54) HYDRAZINE-FREE SOLUTION DEPOSITION OF CHALCOGENIDE FILMS

(75) Inventors: David B. Mitzi, Mahopac, NY (US); Matthew W. Copel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 12/549,297

(22) Filed: Aug. 27, 2009

(65) Prior Publication Data

US 2010/0041907 A1      Feb. 18, 2010

Related U.S. Application Data

(60) Division of application No. 11/506,827, filed on Aug. 21, 2006, now Pat. No. 7,618,841, which is a division of application No. 10/801,766, filed on Mar. 16, 2004, now Pat. No. 7,094,651, which is a continuation-in-part of application No. 10/617,118, filed on Jul. 10, 2003, now Pat. No. 6,875,661.

(51) Int. Cl.
*H01L 29/04* (2006.01)

(52) U.S. Cl. ............... 257/42; 257/66; 257/214; 556/64; 556/81

(58) Field of Classification Search .................... 257/42, 257/49, 66; 556/64, 81
See application file for complete search history.

(56) References Cited

U.S. PATENT DOCUMENTS

| 6,379,585 | B1 | 4/2002 | Vecht et al. | |
|---|---|---|---|---|
| 6,875,661 | B2 * | 4/2005 | Mitzi | 438/285 |
| 7,094,651 | B2 * | 8/2006 | Mitzi et al. | 438/285 |
| 7,341,917 | B2 | 3/2008 | Milliron et al. | |
| 7,618,841 | B2 * | 11/2009 | Mitzi et al. | 438/95 |

OTHER PUBLICATIONS

"The Use of Soluble Metal-Polyselenide Complexes as Precursors to Binary and Ternary Solid Metal Selenides" by Dhingra et al., Mat. Res. Soc. Symp. Proc. vol. 180, 1990, pp. 825-830.
"Successive ionic layer adsorption and reaction (SILAR) method for the deposition of large area (~10cm2) tin disulfide ($SnS_2$) thin films" Sankapal et al., Materials Research Bulletin 35 (2000) pp. 2027-2035.
"Polycrystalline CdSe Films for Thin Film Transistors" Van Calster et al., Journal of Crystal Growth 86 (1988) pp. 924-928.
"Preparation of Thin-Film Transistors with Chemical Bath Deposited CdSe and CdS Thin Films" Gan et al., IEEE Transactions on Electron Devices, vol. 49, No. 1, Jan. 2002, pp. 15-18.

(Continued)

*Primary Examiner* — Long Pham
(74) *Attorney, Agent, or Firm* — Connolly Bove Lodge & Hutz LLP; Vazken Alexanian, Esq.

(57) ABSTRACT

A method of depositing a film of a metal chalcogenide including the steps of: contacting an isolated hydrazinium-based precursor of a metal chalcogenide and a solvent having therein a solubilizing additive to form a solution of a complex thereof; applying the solution of the complex onto a substrate to produce a coating of the solution on the substrate; removing the solvent from the coating to produce a film of the complex on the substrate; and thereafter annealing the film of the complex to produce a metal chalcogenide film on the substrate. Also provided is a process for preparing an isolated hydrazinium-based precursor of a metal chalcogenide as well as a thin-film field-effect transistor device using the metal chalcogenides as the channel layer.

18 Claims, 18 Drawing Sheets

OTHER PUBLICATIONS

"Spin-Coating of $MoS_2$ Thin Films" Putz et al., Institut für Neue Materialien—INM, Department of Coating Technology, Im Stadtwald, Geb. 43, D-66123 Saarbrücken, Germany, 6 pages.

"Solution processed CdS thin film transistors" Schon et al., Thin Solid Films 385 (2001) pp. 271-274.

"A Novel Method for the Preparation of Inorganic Sulfides and Selenides" I. Binary Materials and Group II-VI Phosphors, Davies et al., Journal of the Electrochemical Society, 147 (2), pp. 765-771 (2000).

"All-Inorganic Field Effect Transistors Fabricated by Printing" Ridley et al., Oct. 22, 1999, vol. 286, Science, pp. 746-749.

"A Method for the Clean Syntheses of Sulfides/Selenides" II. Ternary Sulfides/Selenides, Marsh et al., Journal of the Electrochemical Society, 148 (7) pp. D89-D93 (2001).

"Electrical Characterization of $2H-SnS_2$ Single Crystals Synthesized by the Low Temperature Chemical Vapor Transport Method" Shibata et al., J. Phys. Chem. Solids vol. 52, No. 3, pp. 551-553, 1991.

"Spin—coated amorphous chalcogenide films" Chem et al., J. Appl. Phys. 52 (10), Oct. 1982, pp. 6979-6982.

* cited by examiner

HYDRAZINE-FREE SOLUTION DEPOSITION OF CHALCOGENIDE FILMS

This application is a Divisional of U.S. application Ser. No. 11/506,827 filed Aug. 21, 2006 which is a Divisional of U.S. application Ser. No. 10/801,766 filed Mar. 16, 2004, now U.S. Pat. No. 7,094,651 which is a Continuation-in-part of U.S. application Ser. No. 10/617,118, filed Jul. 10, 2003, now U.S. Pat. No. 6,875,661.

BACKGROUND OF THE INVENTION

1. Field of the Invention

The present invention relates to methods of depositing a film of a metal chalcogenide from hydrazine-free solutions and a method of preparing a field-effect transistor including a film of a metal chalcogenide deposited from hydrazine-free solutions. More particularly, the present invention relates to a method of preparing a field-effect transistor including as the channel layer a film of a metal chalcogenide deposited from hydrazine-free solutions.

2. Description of the Prior Art

The ability to deposit high quality semiconducting, metallic and insulating thin films forms one of the important pillars of present-day solid-state electronics. A solar cell may include, for example, a thin n-type semiconductor layer (~0.25 μm) deposited on a p-type substrate, with electrical contacts attached to each layer to collect the photocurrent. Light-emitting diodes (LED's) are typically comprised of a p-n bilayer, which under proper forward bias conditions emits light.

Thin-film field-effect transistors, denoted here as TFT's, include thin p- or n-type semiconducting channel layers, in which the conductivity is modulated by application of a bias voltage to a conducting gate layer that is separated from the channel by a thin insulating barrier. The electronic materials that include modern semiconducting devices have typically been silicon based, but can equally be considered from other families of materials, in some cases potentially offering advantages over the silicon-based technologies.

Thin-film field-effect transistors (TFT's), are widely used as switching elements in electronic applications, most notably for logic and driver circuitry within processor and display applications. Presently, TFT's for many lower-end applications, including those employed in active matrix liquid crystal displays, are made using amorphous silicon as the semiconductor. Amorphous silicon provides a cheaper alternative to crystalline silicon—a necessary condition for reducing the cost of transistors for large area applications. Application of amorphous silicon is limited, however, to slower speed devices, since the mobility (~$10^{-1}$ $cm^2$/V-sec) is approximately 15,000 times smaller than that of crystalline silicon.

In addition, although amorphous silicon is cheaper to deposit than crystalline silicon, deposition of amorphous silicon still requires costly processes such as plasma enhanced chemical vapor deposition. The search for alternative semiconductors (i.e., not silicon), for use in TFT's and other electronic devices is therefore being vigorously pursued.

If a semiconducting material could be identified which simultaneously provides higher mobility and low-cost processing at moderate/low temperatures, many new applications can be envisioned for these materials, including light, flexible, very large-area displays or electronics constructed entirely on plastic.

Recently, organic semiconductors have received considerable attention as potential replacements for inorganic counterparts in TFT's (see, for example, U.S. Pat. No. 5,347,144 assigned to Garnier et. al., entitled "Thin-Layer Field Effect Transistor With MIS Structure Whose Insulator and Semiconductor Are Made of Organic Materials") and LED's [S. E. Shaheen et al., "Organic Light-Emitting Diode with 20 lm/W Efficiency Using a Triphenyldiamine Side-Group Polymer as the Hole Transport Layer," Appl. Phys. Lett. 74, 3212 (1999)].

Organic materials have the advantage of simple and low-temperature thin-film processing through inexpensive techniques such as spin coating, ink jet printing, thermal evaporation, or stamping. Over the last few years, the carrier mobilities of the organic channel layers in OTFTs (organic TFTs) have increased dramatically from <$10^{-4}$ to ~1 $cm^2$/V-sec (comparable to amorphous silicon) [see, for example, C. D. Dimitrakopoulos and D. J. Mascaro, "Organic thin-film transistors: A review of recent advances," IBM J. Res. & Dev. 45, 11-27 (2001)].

While very promising with regard to processing, cost, and weight considerations, organic compounds generally have a number of disadvantages, including poor thermal and mechanical stability. In addition, while the electrical transport in organic materials has improved substantially over the last 15 years; the mobility is fundamentally limited by the weak van der Waals interactions between organic molecules (as opposed to the stronger covalent and ionic forces found in extended inorganic systems).

The inherent upper bound on electrical mobility translates to a cap on switching speeds and therefore on the types of applications that might employ the low-cost organic devices. Organic semiconductors are therefore primarily being considered for lower-end applications.

One approach to improving mobility/durability involves combining the processibility of organic materials with the desirable electrical transport and thermal/mechanical properties of inorganic semiconductors within hybrid systems [D. B. Mitzi et al., "Organic-inorganic Electronics," IBM J. Res. & Dev. 45, 29-45 (2001)]. Organic-inorganic hybrid films have recently been employed as the semiconductive element in electronic devices, including TFTs (see, for example, U.S. Pat. No. 6,180,956, assigned to Chondroudis et al., entitled "Thin-Film Transistors with Organic-Inorganic Hybrid Materials as Semiconducting Channels") and LEDs (see, for example, U.S. Pat. No. 6,420,056, assigned to Chondroudis et.al., entitled "Electroluminescent Device With Dye-Containing Organic-Inorganic Hybrid Materials as an Emitting Layer").

Several simple techniques have been described for depositing crystalline organic-inorganic hybrid films, including multiple-source thermal evaporation, single source thermal ablation, and melt processing.

Solution-deposition techniques (e.g., spin coating, stamping, printing) have also received recent attention and are particularly attractive since they enable the quick and inexpensive deposition of the hybrids on a diverse array of substrates. TFT's based on a spin-coated semiconducting tin(II) iodide-based hybrid have yielded mobilities as high as 1 $cm^2$/V-sec (similar to the best organic-based devices prepared using vapor-phase deposition and amorphous silicon).

Melt-processing of the hybrid systems has improved the grain structure of the semiconducting films, thereby leading to higher mobilities of 2-3 $cm^2$/V-sec [D. B. Mitzi et.al., "Hybrid Field-Effect Transistors Based on a Low-Temperature Melt-Processed Channel Layer," Adv. Mater. 14, 1772-1776 (2002)].

While very promising, current examples of hybrid semiconductors are based on an extended metal halide frameworks (e.g., metal chlorides, metal bromides, metal iodides, most commonly tin(II) iodide). Metal halides are relatively ionic in nature, thereby limiting the selection of possible semiconducting systems with potential for high mobility. In addition, the tin(II)-iodide-based systems in particular are highly air sensitive and all processing must by done under inert-atmosphere conditions. Furthermore, while the tin(II)-iodide-based systems are p-type semiconductors, it is also desirable to find examples of n-type systems, to enable applications facilitated by complementary logic. So far none have been identified.

Another alternative to silicon-based, organic, and metal-halide-based hybrid semiconductors involves the use of metal chalcogenides (e.g., metal sulfides, metal selenides, metal tellurides) as semiconductive elements for use within TFT's and other electronic devices. Some of the earliest solar cells [D. C. Raynolds et al. "Photovoltaic Effect in Cadmium Sulfide," Phy. Rev. 96, 533 (1954)] and TFTs [P. K. Weimer, "The TFT—A New Thin-Film Transistor," Proc. IRE 50, 1462-1469 (1964)] were in fact based on metal chalcogenide active layers. There are numerous examples of metal chalcogenide systems that are potentially useful as semiconductive materials. Tin(IV) sulfide, $SnS_2$, is one candidate that has generated substantial interest as a semiconducting material for solar cells, with n-type conductivity, an optical band gap of ~2.1 eV and a reported mobility of 18 $cm^2$/V-sec [G. Domingo et al., "Fundamental Optical Absorption in $SnS_2$ and $SnSe_2$," Phys. Rev. 143, 536-541 (1966)].

These systems might be expected to yield higher mobility than the organic and metal-halide-based hybrids, as a result of the more covalent nature of the chalcogenides, and also provide additional opportunities for identifying n-type semiconductors.

Reported mobilities of metal chalcogenides, for example, include $SnSe_2$ (27 $cm^2$/V-sec/n-type) [G. Domingo et al., "Fundamental Optical Absorption in $SnS_2$ and $SnSe_2$," Phys. Rev. 143, 536-541 (1966)], $SnS_2$ (18 $cm^2$/V-sec/n-type) [T. Shibata et al., "Electrical Characterization of 2H—$SnS_2$ Single Crystals Synthesized by the Low Temperature Chemical Vapor Transport Method," J. Phys. Chem. Solids 52, 551-553 (1991)], CdS (340 $cm^2$/V-sec/n-type), CdSe (800 $cm^2$/V-sec/n-type) [S. M. Sze, "Physics of Semiconductor Devices," John Wiley & Sons, New York, 1981, p. 849], ZnSe (600 $cm^2$/V-sec/n-type), and ZnTe (100 $cm^2$/V-sec/p-type) [B. G. Streetman, "Solid State Electronic Devices," Prentice-Hall, Inc., New Jersey, 1980, p. 443].

While the potential for higher mobility exists, the increased covalency of the extended metal chalcogenide systems also reduces their solubility and increases the melting temperature, rendering simple and low-cost thin-film deposition techniques for these systems a significant challenge.

A number of techniques have been proposed and employed for the deposition of chalcogenide-based films, including thermal evaporation [A. Van Calster et.al., "Polycrystalline cadmium selenide films for thin film transistors," J. Crystal Growth 86, 924-928 (1988)], chemical vapor deposition (CVD) [L. S. Price et al., "Atmospheric Pressure CVD of SnS and $SnS_2$ on Glass," Adv. Mater. 10, 222-225 (1998)], galvanic deposition [B. E. McCandless et al., "Galvanic Deposition of Cadmium Sulfide Thin Films," Solar Energy Materials and Solar Cells 36, 369-379 (1995)], chemical bath deposition [F. Y. Gan et al., "Preparation of Thin-Film Transistors With Chemical Bath Deposited CdSe and CdS Thin Films," IEEE Transactions on Electron Devices 49, 15-18 (2002)], and successive ionic layer adsorption and reaction (SILAR) [B. R. Sankapal et al., "Successive ionic layer adsorption and reaction (SILAR) method for the deposition of large area (~10 $cm^2$) tin disulfide ($SnS_2$) thin films," Mater. Res. Bull. 35, 2027-2035 (2001)].

However, these techniques are generally not amenable to low-cost, high-thoughput (fast) solution-based deposition techniques such as spin-coating, printing and stamping. What is required for application of the high-thoughput techniques is a truly soluble precursor for the chalcogenide and a suitable solvent. Given the potential for high electrical mobility in the metal chalcogenide systems and both n- and p-channel devices, if a convenient and rapid solution-based technique could be identified for their deposition, the field of low-cost solution-based electronics, currently primarily being pursued within the context of organic electronics, might be extended to higher-end applications, such as logic circuitry and very large area displays.

Spray pyrolysis is one technique employing the rapid decomposition of a soluble precursor [M. Krunks et al., "Composition of $CuInS_2$ thin films prepared by spray pyrolysis," Thin Solid Films 403-404, 71-75 (2002)]. The technique involves spraying a solution, which contains the chloride salts of the metal along with a source of the chalcogen (e.g., $SC(NH_2)_2$), onto a heated substrate (generally in the range 250-450° C.).

While metal chalcogenide films are formed using this technique, the films generally have substantial impurities of halogen, carbon or nitrogen. Annealing in reducing atmospheres of $H_2$ or $H_2S$ at temperatures up to 450° C. can be used to reduce the level of impurities in the film, but these relatively aggressive treatments are not compatible with a wide range of substrate materials and/or require specialized equipment.

Ridley et al. [B. A. Ridley et al., "All-inorganic Field Effect Transistors Frabricated by Printing," Science 286, 746-749 (1999)] describes CdSe semiconducting films that are printed using a soluble metal chalcogenide precursor formed using organic derivatized CdSe nanocrystals. This technique, however, requires the formation of nanocrystals with tight control on particle size distribution in order to enable effective sintering during a postdeposition thermal treatment. The particle size control requires repeated dissolution and centrifugation steps in order to isolate a suitably uniform collection of nanocrystals.

Further, reported TFT devices prepared using this technique exhibited unusual features, including substantial device hysteresis and a negative resistance in the saturation regime, perhaps as a result of trap or interface states either within the semiconducting film or at the interface between the semiconductor and the insulator.

Dhingra et al. have also demonstrated a soluble precursor for metal chalcogenides that can be used to spin coat films of the corresponding metal chalcogenide after thermal treatment to decompose the precursor (see S. Dhingra et al., "The use of soluble metal-polyselenide complexes as precursors to binary and ternary solid metal selenides," Mat. Res. Soc. Symp. Proc. 180, 825-830 (1990).

However, in this process, the species used to solublize the chalcogenide framework (i.e., quarternary ammonium or phosphonium polyselenides), which ultimately decompose from the sample during the heat treatment, are very bulky and most of the film disappears during the annealing sequence (e.g., 70-87%). The resulting films consequently exhibit inferior connectivity and quality.

The large percentage of the sample that is lost during the thermal treatment implies that only relatively thick films can be deposited using this technique, since thin films would be rendered discontinuous (the above mentioned study considered films with thickness ~25-35 μm). Additionally, relatively high temperatures are required for the thermal decomposition of the polyselenides (~530° C.), making this process incompatible with even the most thermally robust plastic substrates (e.g., Kapton sheet can withstand temperatures as high as 400° C.).

A study has also concluded that films of crystalline $MoS_2$ can be spin coated from a solution of $(NH_4)_2MoS_4$ in an organic diamine [J. Pütz and M. A. Aegerter, "Spin-Coating of $MoS_2$ Thin Films," Proc. of International Congress on Glass, vol. 18, San Francisco, Calif., Jul. 5-10, 1998, 1675-1680]. However, high=temperature post-deposition anneals are required to achieve crystalline films (600-800° C.), rendering the process incompatible with organic-based flexible substrate materials.

A similar procedure has led to the formation of amorphous $As_2S_3$ and $As_2Se_3$ films [G. C. Chern and I. Lauks, "Spin-Coated Amorphous Chalcogenide Films," J. Applied Phys. 53, 6979-6982 (1982)], but attempts to deposit other main-group metal chalcogenides, such as $Sb_2S_3$ and $GeS_x$ have not been successful, due to the low solubility of the precursors in the diamine solvents [J: Pütz and M. A. Aegerter, "Spin-Coating of $MoS_2$ Thin Films," Proc. of International Congress on Glass, vol. 18, San Francisco, Calif., Jul. 5-10, 1998, 1675-1680].

Improvement in the above-described solution-based processes are therefore required for practical applications, especially for the fabrication of crystalline films of main-group metal chalcogenides, such as those derived from Ge, Sn, Pb, Sb, Bi, Ga, In, Tl, which can potentially provide high mobility in a semiconductor with reasonable band gap for a transistor.

If semiconducting materials and processing techniques could be identified which simultaneously provide high carrier mobility and low-cost processing at moderate/low temperatures, many new applications could be envisioned for these technologies, including light, flexible, very large-area displays or electronics constructed entirely on plastic.

The commonly owned co-pending U.S. application Ser. No. 10/617,118, Filed on Jul. 10, 2003, entitled "Solution Deposition of Chalcogenide Films", the contents of which are incorporated herein by reference, describes a novel solution-deposition process for preparing semiconducting chalcogenide films by a process that employs a metal chalcogenide in a hydrazine compound to deposit the chalcogenide films.

While this process enables the deposition of high quality ultrathin spin-coated films with field-effect mobilities as high as 10 $cm^2$/V-sec, approximately an order of magnitude higher than previous examples of spin-coated semiconductors, the process has the disadvantage that it requires spinning the film from a solution containing hydrazine, which is a highly toxic and reactive substance.

In view of this disadvantage, it is highly desirable to provide a process, which avoids the use of hydrazine as the solvent altogether in the process of depositing high quality ultrathin spin-coated films.

Accordingly, it is highly desirable to provide a process for preparation of semiconducting chalcogenide films without the use of hydrazine as the solvent to overcome the high toxicity and reactivity concerns and, simultaneously, reduce the environmental impact and manufacturing cost of the fabricated films, without the need for additional specialized equipment which otherwise would be required to handle a toxic solvent such as hydrazine.

SUMMARY OF THE INVENTION

The present invention provides a hydrazinium metal chalcogenide represented by the formula:

$$M_zX_q(R^1R^2N-NHR^3R^4)_{2q-nz}(R^1R^2N-NR^3R^4)_m$$

wherein: M is a main-group metal having a valence n, wherein n is an integer from 1 to 6; X is a chalcogen; z is an integer from 1 to 10; q is an integer from 1 to 30; m is from 1 to 30.5; and each of $R^1$, $R^2$, $R^3$ and $R^4$ is independently selected from hydrogen, aryl, methyl, ethyl and a linear, branched or cyclic alkyl of 3-6 carbon atoms.

The present invention also provides a method of depositing a film of a metal chalcogenide. The method includes the steps of: contacting an isolated hydrazinium-based precursor of a metal chalcogenide and a solvent having therein a solubilizing additive to form a solution of a complex thereof; applying the solution of the complex onto a substrate to produce a coating of the solution on the substrate; removing the solvent from the coating to produce a film of the complex on the substrate; and thereafter annealing the film of the complex to decompose the complex and produce a metal chalcogenide film on the substrate.

The present invention further provides a method of forming a field-effect transistor of the type having a source region and a drain region, a channel layer extending between the source region and the drain region, the channel layer including a semiconducting material, a gate region disposed in spaced adjacency to the channel layer, an electrically insulating layer between the gate region and the source region, drain region and channel layer, including:

preparing a channel layer including a film of a metal chalcogenide semiconducting material which is by a method including the steps of: contacting an isolated hydrazinium-based precursor of a metal chalcogenide and a solvent having therein a solubilizing additive to form a solution of a complex thereof; applying the solution of the complex onto a substrate to produce a coating of the solution on the substrate; removing the solvent from the coating to produce a film of the complex on the substrate; and thereafter annealing the film of the complex to decompose the complex and produce a metal chalcogenide film on the substrate.

The present invention still further provides a first process for preparing an isolated hydrazinium-based precursor of a metal chalcogenide. The first process includes the steps of: contacting: at least one metal chalcogenide, a hydrazine compound represented by the formula:

$$R^1R^2N-NR^3R^4$$

wherein each of $R^1$, $R^2$, $R^3$ and $R^4$ is independently selected from hydrogen, aryl, methyl, ethyl and a linear, branched or cyclic alkyl of 3-6 carbon atoms, and optionally an elemental chalcogen selected from S, Se, Te and a combination thereof, to produce a solution of a hydrazinium-based precursor of the metal chalcogenide in the hydrazine compound; and isolating the hydrazinium-based precursor of the metal chalcogenide as a substantially pure product.

The present invention additionally provides a second process for preparing an isolated hydrazinium-based precursor of a metal chalcogenide. The second process includes the steps of: contacting: at least one metal chalcogenide and a salt of an amine compound with $H_2S$, $H_2Se$ or $H_2Te$, wherein the amine compound is represented by the formula:

$$NR^5R^6R^7$$

wherein each of $R^5$, $R^6$ and $R^7$ is independently selected from hydrogen, aryl, methyl, ethyl and a linear, branched or cyclic alkyl of 3-6 carbon atoms, to produce an ammonium-based precursor of the metal chalcogenide; contacting the ammonium-based precursor of the metal chalcogenide, a hydrazine compound represented by the formula:

$$R^1R^2N-NR^3R^4$$

wherein each of $R^1$, $R^2$, $R^3$ and $R^4$ is independently selected from hydrogen, aryl, methyl, ethyl and a linear, branched or cyclic alkyl of 3-6 carbon atoms, and optionally, an elemental chalcogen selected from S, Se, Te and a combination thereof; to produce a solution of a hydrazinium-based precursor of the metal chalcogenide in the hydrazine compound; and isolating hydrazinium-based precursor of the metal chalcogenide as a substantially pure product.

A hydrazinium metal chalcogenide according to the present invention can be prepared as an isolated product in a substantially pure form by either the first or second process described above.

The films prepared according to the present invention have the advantage of being low cost. The devices that employ metal chalcogenide semiconducting materials as the channel layer yield the highest mobilities currently reported for an n-type spin-coated device.

Additionally, the device characteristics are better behaved than those reported by Ridley et al. al. [B. A. Ridley et al., "All-Inorganic Field Effect Transistors Fabricated by Printing," Science 286, 746-749 (1999)], in which CdSe semiconducting films are printed using a soluble metal chalcogenide precursor formed using organic derivatized CdSe nanocrystals.

An important advantage of the present invention results from the fact that the present invention separates the steps of forming the soluble hydrazinium based precursor from the solution processing the thin film so that a chemical company could prepare the hydrazinium precursor and the device maker could spin the films. Thus, a chemical company can prepare the hydrazinium precursor more efficiently because it is equipped to handle the toxic and reactive hydrazine and hydrazine derivatives in the plant. The device maker could then buy the precursor and spin the films according to its needs by using a less toxic solvent in its manufacturing plants.

The low-cost metal chalcogenide semiconducting materials produced according to the present invention can be used in a variety of applications, including flat panel displays, non-linear optical/photo-conductive devices, chemical sensors, emitting and charge transporting layers in light-emitting diodes, thin-film transistors, channel layers in field-effect transistors and media for optical data storage, including phase change media for optical data storage.

DETAILED DESCRIPTION OF THE INVENTION

Figure 1:
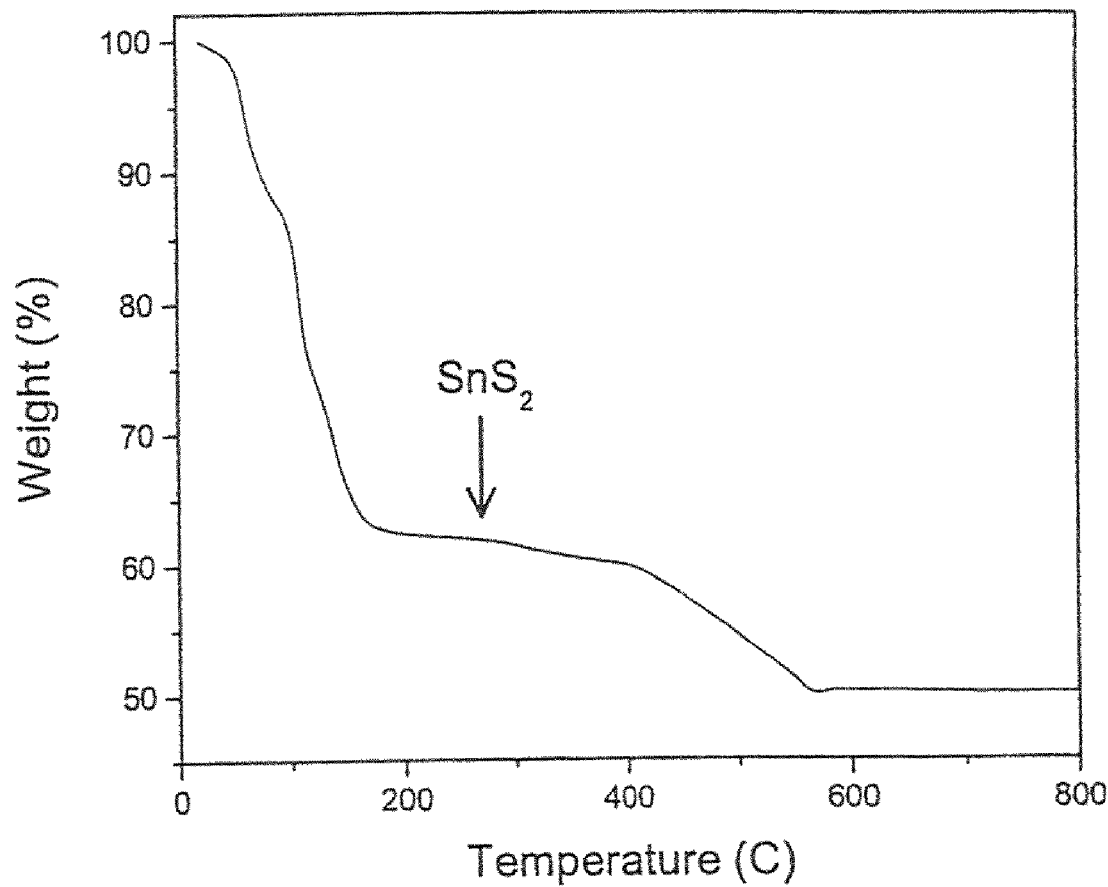
FIG. 1 depicts the Thermogravimetric Analysis (TGA) scan of the hydrazinium tin(IV) sulfide precursor.

The previously incorporated commonly owned co-pending U.S. application Ser. No. 10/617,118, Filed on Jul. 10, 2003, entitled "Solution Deposition of Chalcogenide Films" describes novel solution-deposition methods (Method 1 and Method 2) for preparing semiconducting chalcogenide films by a process that employs a metal chalcogenide in a hydrazine compound to deposit the chalcogenide films. The hydrazinium-based precursor in these methods is formed in situ, i.e., the hydrazine compound, which is toxic and hazardous to handle, is the solvent. Thus, in Method 1 and Method 2, the hydrazinium-based precursor is not isolated.

Formation of Films from Isolated Hydrazinium-based Precursor

In contrast to the approach in Methods 1 and 2, the present invention provides a new method, namely Method 3, of depositing thin films of metal chalcogenides using an isolated hydrazinium-based precursor of the metal chalcogenide to deposit the chalcogenide films. This method avoids the use of the hydrazine compound in the method of depositing the chalcogenide films.

The method of depositing the chalcogenide films in which an isolated hydrazinium-based precursor is used, i.e., Method 3, includes the steps of:

contacting an isolated hydrazinium-based precursor of a metal chalcogenide, or mixtures of metal chalcogenides, and a solvent having therein a solubilizing additive to form a solution of a complex thereof;

applying the solution of the complex onto a substrate to produce a coating of the solution on the substrate;

removing the solvent from the coating to produce a film of the complex on the substrate; and thereafter annealing the film of the complex to decompose the complex and produce a metal chalcogenide film on the substrate.

The step of contacting an isolated hydrazinium-based precursor of a metal chalcogenide and a solvent that has therein a solubilizing additive produces a complex of the metal chalcogenide in which the hydrazine has been substantially replaced by the solubilizing additive to form the complex.

Suitable solvents include water, lower alcohols, such as, methanol, ethanol, propanol, iso-propanol, n-butanol, iso-butyl alcohol, sec-butyl alcohol, cyclohexanol, ethers, such as, diethyl ether, dibutyl ether, esters, such as, ethyl acetate, propyl acetate, butyl acetate, other solvents, such as, alkylene glycol of 2-6 carbon atoms, dialkylene glycol of 4-6 carbon atoms, trialkylene glycol of 6 carbon atoms, glyme, diglyme, triglyme, propylene glycol monoacetate, DMSO, DMF, DMA, HMPA and a mixture thereof.

The solubilizing additive can be an aliphatic amine of 1-10 carbon atoms, aromatic amine of 4-10 carbon atoms, aminoalcohol of 2-6 carbon atoms or a mixture thereof.

Preferably, the aliphatic amine is selected from n-propylamine, iso-propylamine, n-butylamine, sec-butylamine, iso-butylamine, pentylamine, n-hexylamine, cyclohexylamine and phenethylamine, and the aromatic amine preferably is pyridine, aniline or aminotoluene. The aminoalcohol is preferably selected from ethanolamine, propanolamine, diethanolamine, dipropanolamine, triethanolamine and tripropanolamine. Other suitable amines can also be used provided they promote solubility of the hydrazinium-based precursor of a metal chalcogenide in the solvent selected.

The film deposition of the hydrazinium-based precursor is carried out by standard solution-based techniques using a solution of an isolated hydrazinium-based precursor in a solvent. Suitable solution-based techniques include spin coating, stamping, printing; or dip coating, using the above-mentioned solution. After removing the solvent, a short low-temperature anneal (typically, at a temperature less than about 350° C.) is carried out to decompose the hydrazinium chalcogenide salts from the sample and to improve the crystallinity of the resulting metal chalcogenide film.

The present invention provides semiconducting materials and processing techniques which simultaneously provide high carrier mobility and low-cost processing at moderate/low temperatures, with many new applications of these technologies, including light, flexible, very large-area displays or electronics constructed entirely on plastic.

The present invention enables the deposition of high quality ultrathin spin-coated films with field-effect mobilities as high as 10 cm$^2$/V-sec, approximately an order of magnitude higher than previous examples of spin-coated semiconductors.

The present invention includes four stages:
1. Isolating (synthesizing) the hydrazinium precursor of the metal chalcogenide compound;
2. Forming a solution of the hydrazinium precursor in a suitably chosen non-hydrazine-based solvent mixture;
3. Solution processing a thin film of the chalcogenide precursor from the solution mixture described in stage 2 using a technique such as spin coating, stamping or printing; and
4. Decomposing the resulting precursor film into a film of the desired metal chalcogenide using heat achieved, for example, by placing the film on a hot plate, in an oven, or by using laser-based annealing.

Preferably, solution processing in stage 3 is accomplished by spin coating.

The heating of the film in stage 4 is preferably accomplished by placing a substrate containing the film on a hot plate with the temperature set between 50° C. and 450° C. for a period of time between 0.5 min to 120 min.

The metal chalcogenide compound described in stage 1 preferably includes a main group metal and a chalcogen (e.g., $SnS_2$, $SnSe_2$, $SnS_{2-x}Se_x$, $In_2Se_3$, $GeSe_2$, $Sb_2S_3$, $Sb_2Se_3$, $Sb_2Te_3$).

The non-hydrazine-based solvent of stage 2 preferably includes an organic amine (e.g., propylamine, butylamine, phenethylamine, etylenediamine).

The non-hydrazine-based solvent mixture of stage 2 preferably includes excess chalcogen (S, Se, Te) mixed with the organic amine to control the resulting metal chalcogenide stoichiometry and improve the film formation.

Preferably, the metal chalcogenide film is in the form of a thin film and the thin film has a thickness of from about 5 Å to about 2,000 Å, more preferably from about 5 Å to about 1,000 Å.

The metal chalcogenide film can include a polycrystalline metal chalcogenide which has a grain size equal to or greater than the dimensions between contacts in a semiconductor device. However, the metal chalcogenide film can include single crystals of the metal chalcogenide.

Annealing is carried out at a temperature and for a length of time sufficient to produce the metal chalcogenide film. Preferably, the temperature is from about 25° C. to about 500° C. More preferably, the temperature is from about 250° C. to about 350° C.

Using this technique, tertiary or higher order systems, such as, $(SnS_{2-x}Se_x)$ can also be conveniently formed as thin films, enabling more detailed control over the band gap of the materials deposited. Thus, the present invention can be used most advantageously to form main-group metal (e.g., Ge, Sn, Pb, Sb, Bi, Ga, In, Tl) chalcogenide thin films.

As a first demonstration of the present invention, films of $SnS_2$ are deposited and characterized. In this case, the metal chalcogenide films can be deposited using spin coating, although they could equally be deposited using other solution-based techniques.

Following film deposition, low-temperature heat treatment of the film, typically at less than about 350° C., yields a crystalline film of the desired metal chalcogenide, with the loss of hydrazine and hydrazinium chalcogenide and the decomposition products of these compounds.

The films prepared by any of the methods of the present invention can be removed from the substrate to produce an isolated film thereof.

Preferably, the substrate is fabricated from a material having at least one property selected from the following: thermally stable, i.e., stable up to about at least 300° C., chemically inert towards the metal chalcogenides, rigid or flexible. Suitable examples include Kapton, polycarbonate, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium(IV) oxide ($CeO_2$), tin oxide ($SnO_2$), zinc titanate ($ZnTiO_2$), a plastic material or a combination thereof. Preferably, the metal substrate is a metal foil, such as, aluminum foil, tin foil, stainless steel foil and gold foil, and the plastic material preferably is polycarbonate, Mylar or Kevlar.

The processes described herein are useful in forming semiconductor films for applications including, for example, thin-film transistors (TFTs), light-emitting devices (LED's) and data storage media.

There are numerous examples of metal chalcogenide systems that are potentially useful as semiconductive materials. Tin(IV) sulfide, $SnS_2$, is one candidate that has generated substantial interest as a semiconducting material for solar cells, with n-type conductivity, an optical band gap of ~2.1 eV and a reported mobility of 18 $cm^2$/V-sec [G. Domingo et al., "Fundamental Optical Absorption in $SnS_2$ and $SnSe_2$," Phys. Rev. 143, 536-541 (1966)].

Preparation of Isolated Hydrazinium-Based Precursor

The present invention further provides a first and a second process for preparing the hydrazinium-based precursor of a metal chalcogenide as an isolated product.

The first process for preparing the hydrazinium-based precursor includes the steps of:

contacting at least one metal chalcogenide, a hydrazine compound represented by the formula:

$$R^1R^2N-NR^3R^4$$

wherein each of $R^1$, $R^2$, $R^3$ and $R^4$ is independently selected from hydrogen, aryl, methyl, ethyl and a linear, branched or cyclic alkyl of 3-6 carbon atoms, and optionally an elemental chalcogen selected from S, Se, Te and a combination thereof, to produce a solution of a hydrazinium-based precursor of the metal chalcogenide in the hydrazine compound; and isolating the hydrazinium-based precursor of the metal chalcogenide as a substantially pure product.

A possible mechanism that may be operative in the above system is the following:

$$N_2H_4 + 2X \rightarrow N_2 \text{ (gas)} + 2H_2X \quad (1)$$

$$4N_2H_4 + 2H_2X + 2MX_2 \rightarrow 4N_2H_5^+ + M_2X_6^{4-} \text{(in solution)} \quad (2)$$

wherein M=a metal and X=S or Se.

The second process for preparing the hydrazinium-based precursor includes the steps of:

contacting: at least one metal chalcogenide and a salt of an amine compound with $H_2S$, $H_2Se$ or $H_2Te$, wherein the amine compound is represented by the formula:

$$NR^5R^6R^7$$

wherein each of $R^5$, $R^6$ and $R^7$ is independently selected from hydrogen, aryl, methyl, ethyl and a linear, branched or cyclic alkyl of 3-6 carbon atoms, to produce an ammonium-based precursor of the metal chalcogenide;

contacting the ammonium-based precursor of the metal chalcogenide, a hydrazine compound represented by the formula:

$$R^1R^2N-NR^3R^4$$

wherein each of $R^1$, $R^2$, $R^3$ and $R^4$ is independently selected from hydrogen, aryl, methyl, ethyl and a linear, branched or cyclic alkyl of 3-6 carbon atoms, and optionally, an elemental chalcogen selected from S, Se, Te and a combination thereof; to produce a solution of a hydrazinium-based precursor of the metal chalcogenide in the hydrazine compound; and isolating hydrazinium-based precursor of the metal chalcogenide as a substantially pure product.

Preferably, each of $R^5$, $R^6$ and $R^7$ can independently be hydrogen, aryl, methyl and ethyl. More preferably, $R^5$, $R^6$ and $R^7$ are all hydrogens.

Preferably, in this process each of $R^1$, $R^2$, $R^3$ and $R^4$ is independently hydrogen, aryl, methyl or ethyl. More preferably, the hydrazine compound is hydrazine, i.e., where $R^1$, $R^2$, $R^3$ and $R^4$ are all hydrogens, methylhydrazine or 1,1-dimethylhydrazine.

Preferably, the amine compound is $NH_3$, $CH_3NH_2$, $CH_3CH_2NH_2$, $CH_3CH_2CH_2NH_2$, $(CH_3)_2CHNH_2$, $CH_3CH_2CH_2CH_2NH_2$, phenethylamine, 2-fluorophenethylamine, 2-chlorophenethylamine, 2-bromophenethylamine, 3-fluorophenethylamine, 3-chlorophenethylamine, 3-bromophenethylamine, 4-fluorophenethylamine, 4-chlorophenethylamine, 4-bromophenethylamine, 2,3,4,5,6-pentafluorophenethylamine or a combination thereof.

The ammonium metal chalcogenide precursor can be prepared by a variety of techniques depending on the metal chalcogenide under consideration. Examples of such techniques include simple dissolution of the metal chalcogenide in an ammonium chalcogenide aqueous solution followed by evaporation of the solution, typically at room temperature, solvothermal techniques and by solid-state routes at elevated temperatures. In contrast to most metal chalcogenides, which are not substantially soluble in common solvents, the ammonium salts can be highly soluble in hydrazine with the vigorous evolution of ammonia and the formation of the hydrazinium salts of the metal chalcogenide [L. F. Audrieth et al., "The Chemistry of Hydrazine," John Wiley & Sons, New York, 200 (1951)]. For example, the solubility of the ammonium-based SnS2 precursor, exceeds 200 g/l in hydrazine.

Isolation of the hydrazinium-based precursor of the metal chalcogenide as a substantially pure product from the first or second process of the present invention can be accomplished by any suitable method or procedure known to a person skilled in the art. Such suitable methods include, but are not limited to, the following:

1. evaporation of the solvent to produce the hydrazinium-based precursor of the metal chalcogenide as a substantially pure solid;

2. precipitation of the hydrazinium-based precursor of the metal chalcogenide by addition of a solvent in which the hydrazinium-based precursor of the metal chalcogenide is less soluble or substantially insoluble followed by filtration of the precipitate; and 3. cooling of the reaction mixture to precipitate the hydrazinium-based precursor of the metal chalcogenide from the reaction mixture followed by filtration of the precipitate.

Because the hydrazine moieties that solubilize the metal chalcogenide structure only weakly interact with the metal chalcogenide framework, they can be conveniently removed from the precursor film at low temperatures. Additionally, the starting materials are all chalcogenides (not halides or oxides), and therefore impurities of these elements are absent from the final films.

The present invention is distinct from the earlier disclosed use of hydrazine hydrate as a solvent for the precipitation of certain metal sulfides and selenides (e.g., zinc sulfide, copper selenide, silver-doped zinc sulfide, copper-doped zinc cadmium sulfide) [U.S. Pat. No. 6,379,585, assigned to Vecht et al., entitled "Preparation of Sulfides and Selenides]". In the case of this previous work, the solvent (which always involves water, as well as hydrazine) generally enables the precipitation of a transition metal chalcogenide, rather than the dissolution of the metal chalcogenide for further solution-based processing.

The present techniques are not limited to the use of hydrazine. Other hydrazine-like solvents such as 1,1-dimethylhydrazine and methylhydrazine or mixtures of hydrazine-like solvents with other solvents, including water, methanol, ethanol, acetonitrile and N,N-dimethylformamide, can also be used.

The chalcogenide can further include an elemental chalcogen, such as, S, Se, Te or a combination thereof.

The hydrazinium-based precursor, i.e., hydrazinium metal chalcogenide, is represented by the formula:

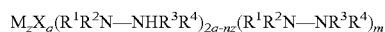

$$M_z X_q (R^1 R^2 N\text{—}NHR^3 R^4)_{2q-nz} (R^1 R^2 N\text{—}NR^3 R^4)_m$$

wherein:

M is a main-group metal having a valence n, wherein n is an integer from 1 to 6;

X is a chalcogen;

z is an integer from 1 to 10;

q is an integer from 1 to 30;

m is from 1 to 30.5; and each of $R^1$, $R^2$, $R^3$ and $R^4$ is independently selected from hydrogen, aryl, methyl, ethyl and a linear, branched or cyclic alkyl of 3-6 carbon atoms.

The metal chalcogenides include a metal, such as, Ge, Sn, Pb, Sb, Bi, Ga, In, Tl or a combination thereof and a chalcogen, such as, S, Se, Te or a combination thereof.

In one embodiment, the metal chalcogenide can be represented by the formula MX or $MX_2$ wherein M is a metal, such as, Ge, Sn, Pb or a combination thereof and wherein X is a chalcogen, such as, S, Se, Te or a combination thereof.

In another embodiment, the metal chalcogenide can be represented by the formula $M_2X_3$ wherein M is a metal, such as, Sb, Bi, Ga, In or a combination thereof and wherein X is a chalcogen, such as, S, Se, Te or a combination thereof.

In yet another embodiment, the metal chalcogenide can be represented by the formula $M_2X$ wherein M is Tl and wherein X is a chalcogen, such as, S, Se, Te or a combination thereof.

Preferably, the metal is Sn or Sb and the chalcogen is S or Se.

Examples of such chalcogenide systems include compounds represented by the formula:

$$Sn(S_{2-x}Se_x)$$

wherein x is from 0 to 2, including $SnS_2$ and $SnSe_2$.

Thin Film Field Effect Transistor Devices

The present invention further provides an improved thin-film field-effect transistor (TFT) device with a semiconducting channel layer that is deposited using the above-described 4 stage approach.

Such devices prepared according to the present invention yield the highest mobilities currently reported for an n-type solution-processed device. Additionally, the device characteristics are better behaved than those reported by Ridley et al. [B. A. Ridley et al., "All-Inorganic Field Effect Transistors Fabricated by Printing," Science 286, 746-749 (1999)], in which CdSe semiconducting films are printed using a soluble metal chalcogenide precursor formed using organic derivatized CdSe nanocrystals.

Accordingly, the present invention includes an improved field-effect transistor, based on a solution-processed chalcogenide channel layer using a method that employs an isolated hydrazinium based precursor according to the present invention. The field-effect transistor is a thin film field-effect transistor (FET) device having a film of a metal chalcogenide semiconducting material as the active semiconductor layer.

The present invention provides a method of preparing a field-effect transistor of the type having a source region and a drain region, a channel layer extending between the source region and the drain region, the channel layer including a semiconducting material, a gate region disposed in spaced adjacency to the channel layer, an electrically insulating layer between the gate region and the source region, drain region and channel layer, including:

preparing a channel layer including a film of a metal chalcogenide semiconducting material by a method including the steps of: contacting an isolated hydrazinium-based precursor of a metal chalcogenide and a solvent having therein a solubilizing additive to form a solution of a complex thereof; applying the solution of the complex onto a substrate to produce a coating of the solution on the substrate; removing the solvent from the coating to produce a film of the complex on the substrate; and thereafter annealing the film of the complex to decompose the complex and produce a metal chalcogenide film on the substrate.

Figure 4:
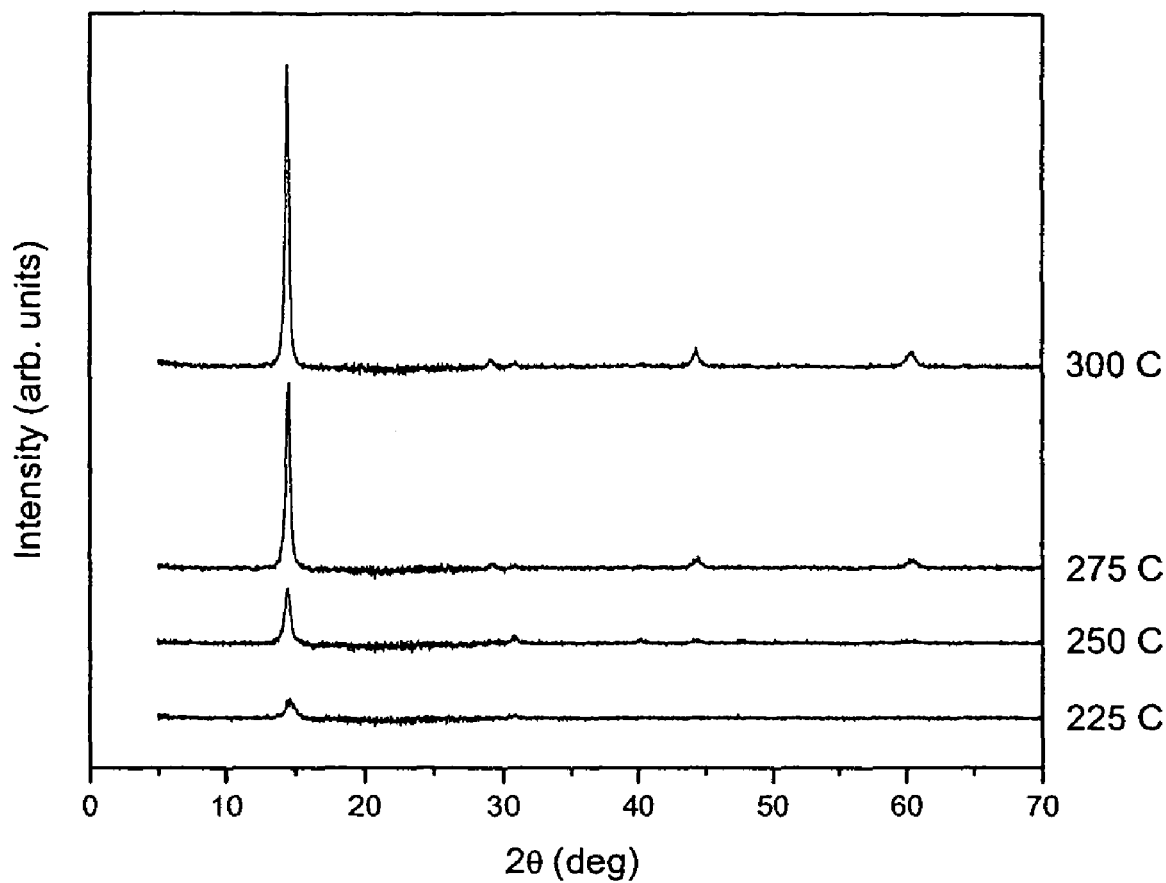
FIG. 4 depicts the X-ray diffraction patterns of tin(IV) selenide precursor films deposited by Method 1 using spin coating.

In one embodiment, the source region, channel layer and drain region are preferably disposed upon a surface of a substrate, the electrically insulating layer is disposed over the channel layer and extending from the source region to the drain region, and the gate region is disposed over the electrically insulating; layer, for example, as shown in FIG. 4 of U.S. Pat. No. 6,180,956, the contents of which are incorporated herein by reference.

Figure 3:
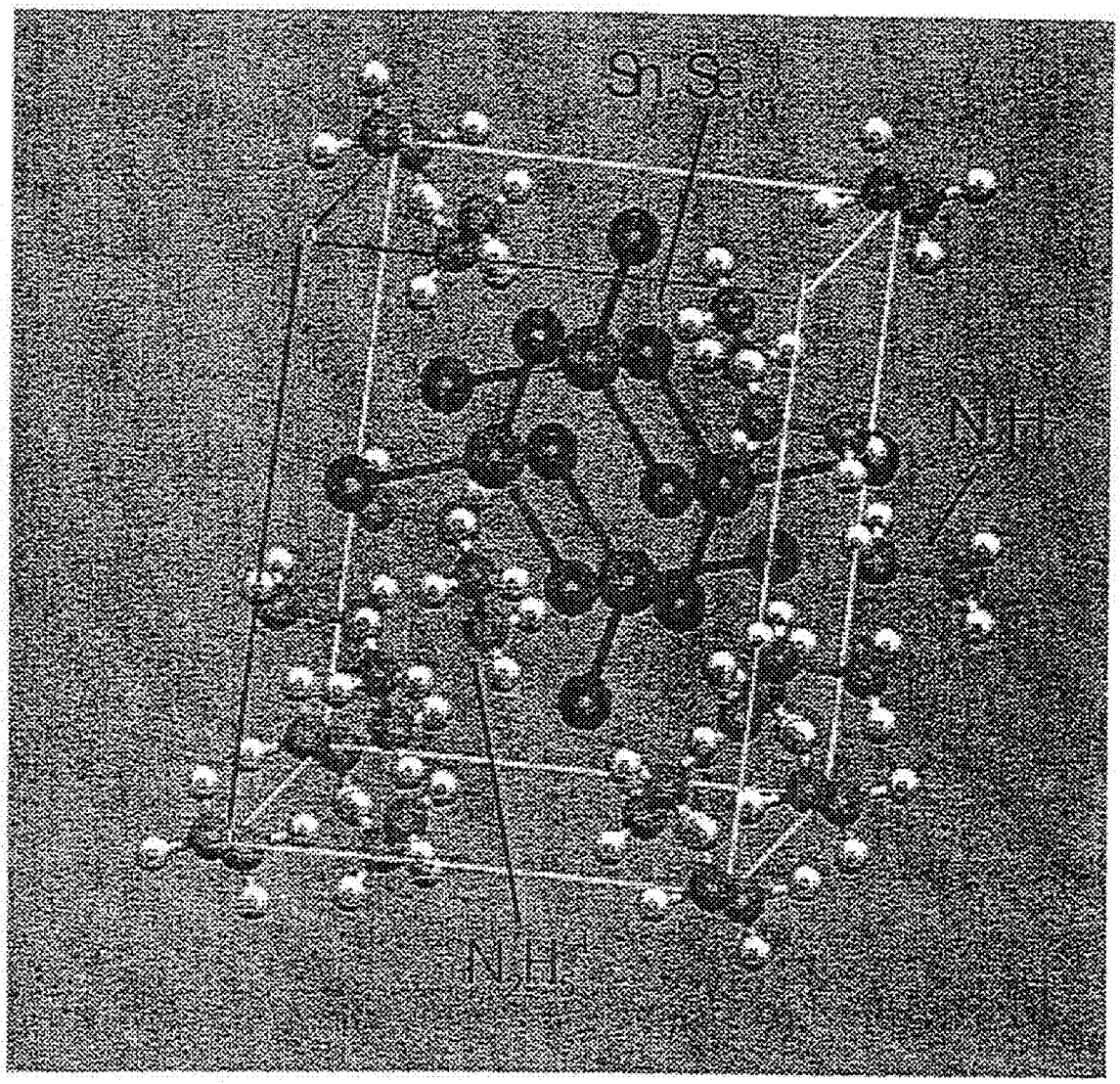
FIG. 3 depicts the X-ray crystal structure of $(N_2H_4)_3(N_2H_5)_4Sn_2Se_6$, including $Sn_2Se_6^{4-}$ dimers alternating with hydrazinium cations and neutral hydrazine molecules.

In another embodiment, the gate region is disposed as a gate layer upon a surface of a substrate, the electrically insulating layer is disposed upon the gate layer, and the source region, channel layer, and drain region are disposed upon the electrically insulating layer, for example, as shown in FIG. 3 of the previously incorporated U.S. Pat. No. 6,180,956.

Preferably, the metal chalcogenide semiconducting material is in the form of a thin film, in which the metal chalcogenide semiconducting material is a polycrystalline material having a grain size equal to or greater than the dimensions between contacts in the semiconductor device. Accordingly, the present invention can provide an improved field-effect transistor prepared by the aforementioned method.

Formation of Films without Isolation of the Hydrazinium-based Precursor

The present invention further provides a simple method (Method 1) of depositing thin films of metal chalcogenides involving the use of a hydrazine (or other hydrazine-like solvents)/chalcogenide mixture as solvent for metal chalcogenides or mixtures of metal chalcogenides. In this method, the hydrazinium-based precursor is not isolated. The film deposition of the hydrazinium-based precursor is carried out by standard solution-based techniques including spin coating, stamping, printing, or dip coating, using the above-mentioned solution. Thereafter, a short low-temperature anneal (typically, at a temperature less than about 350° C.) is carried out to remove excess hydrazine and hydrazinium chalcogenide salts from the sample and to improve the crystallinity of the resulting metal chalcogenide film.

The first method, in which the hydrazinium-based precursor is not isolated, includes the steps of:

contacting: at least one metal chalcogenide; a hydrazine compound represented by the formula:

wherein each of $R^1$, $R^2$, $R^3$ and $R^4$ is independently hydrogen, aryl, methyl, ethyl or a linear, branched or cyclic alkyl of 3-6 carbon atoms; and optionally, an elemental chalcogen, such as, S, Se, Te or a combination thereof; to produce a solution of a hydrazinium-based precursor of the metal chalcogenide;

applying the solution of the hydrazinium-based precursor of the metal chalcogenide onto a substrate to produce a film of the precursor; and thereafter annealing the film of the precursor to remove excess hydrazine and hydrazinium chalcogenide salts to produce a metal chalcogenide film on the substrate.

The present invention also provides a simple method (Method 2) of depositing thin films of metal chalcogenides involving: (1) the synthesis of a soluble ammonium-based precursor; (2) the use of hydrazine as a solvent for the precursor; (3) the deposition of a film using a standard solution-based technique (mentioned above) and (4) low-temperature annealing. The annealing step can be carried out at a temperature from about room temperature to about 500° C., but typically it is carried out at a temperature from about 250° C. to about 350° C.).

The second method (Method 2) in which the hydrazinium-based precursor is not isolated, is similar to the first method (Method 1), except that a chalcogenide and an amine are first contacted to produce an ammonium-based precursor of the metal chalcogenide, which is then contacted with a hydrazine compound and and optionally, an elemental chalcogen. This method includes the steps of:

contacting: at least one metal chalcogenide and a salt of an amine compound with $H_2S$, $H_2Se$ or $H_2Te$, wherein the amine compound is represented by the formula:

wherein each of $R^5$, $R^6$ and $R^7$ is independently hydrogen, aryl, methyl, ethyl or a linear, branched or cyclic alkyl of 3-6 carbon atoms, to produce an ammonium-based precursor of the metal chalcogenide;

contacting the ammonium-based precursor of the metal chalcogenide, a hydrazine compound represented by the formula:

wherein each of $R^1$, $R^2$, $R^3$ and $R^4$ is independently hydrogen, aryl, methyl, ethyl or a linear, branched or cyclic alkyl of 3-6 carbon atoms, and optionally, an elemental chalcogen, such as, S, Se, Te or a combination thereof, to produce a solution of a hydrazinium-based precursor of the metal chalcogenide in the hydrazine compound;

applying the solution of the isolated hydrazinium-based precursor of the metal chalcogenide onto a substrate to produce a film of the precursor; and thereafter annealing the film of the precursor to remove excess hydrazine and hydrazinium chalcogenide salts to produce a metal chalcogenide film on the substrate.

Referring to the Figures:

FIG. 1 depicts the Thermogravimetric Analysis (TGA) scan of the hydrazinium tin(IV) sulfide precursor, synthesized from $SnS_2$, S, and hydrazine, and run at 2° C./min to 800° C. in flowing nitrogen.

Figure 2:
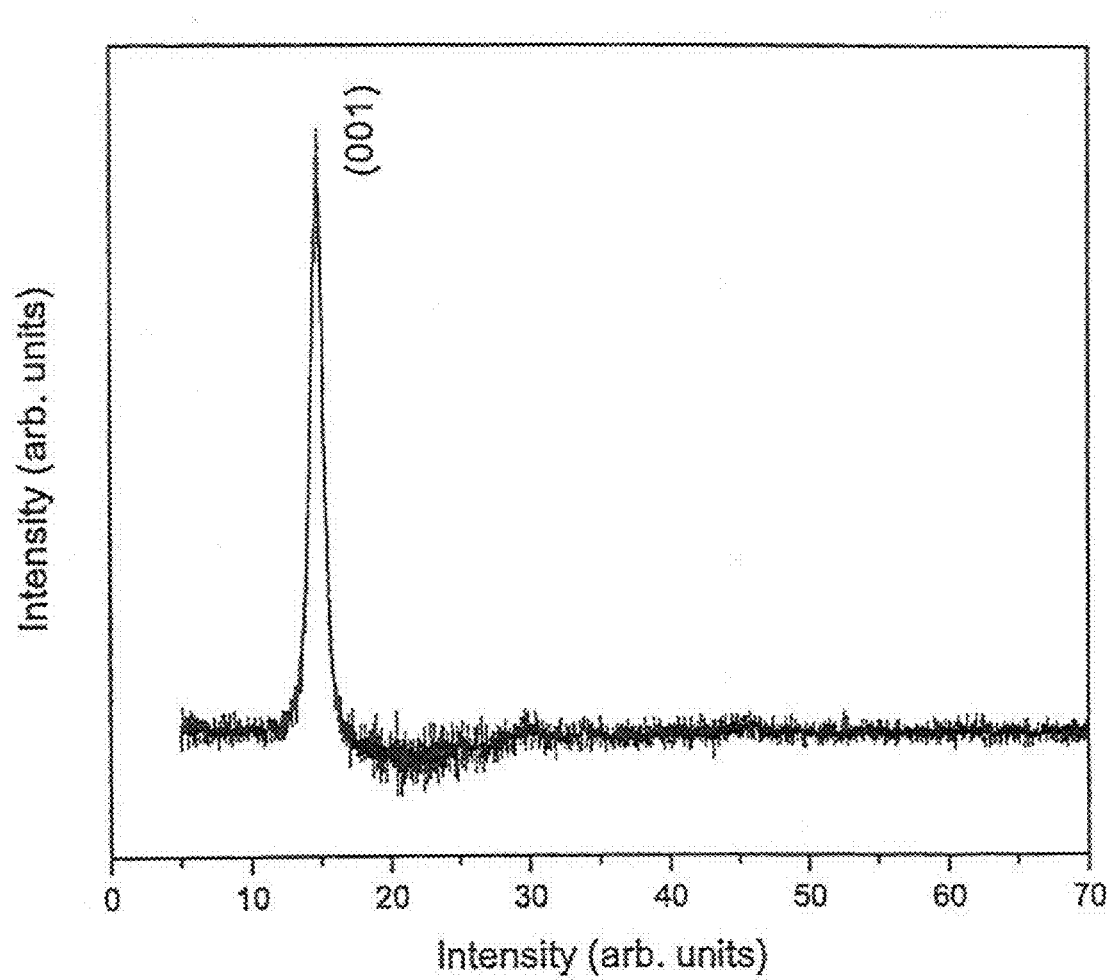
FIG. 2 depicts the X-ray diffraction pattern of a tin(IV) sulfide film deposited by Method 1 using spin coating.

FIG. 2 depicts the X-ray diffraction pattern of a tin(IV) sulfide film deposited by Method 1 using spin coating and annealed at 300° C. for 10 min. The calculated c-axis parameter is 5.98 Å, consistent with the published bulk sample values for $SnS_2$, 5.90 Å [B. Palosz et al., J. Appl. Crystallogr. 22, 622 (1989)].

FIG. 3 depicts the X-ray crystal structure of $(N_2H_4)_3(N_2H_5)_4Sn_2Se_6$, including $Sn_2Se_6^{4-}$ dimers alternating with hydrazinium cations and neutral hydrazine molecules.

FIG. 4 depicts the X-ray diffraction patterns of tin(IV) selenide precursor films deposited by Method 1 using spin coating and annealed at (a) 225° C., (b) 250° C., (c) 275° C., (d) 300° C. The films exhibit increasing crystallinity with increasing anneal temperature, as well as substantial c-axis preferred orientation. The calculated c-axis parameter using the 300° C. film is 6.13 Å, consistent with published bulk sample values for $SnSe_2$.

Figure 5:
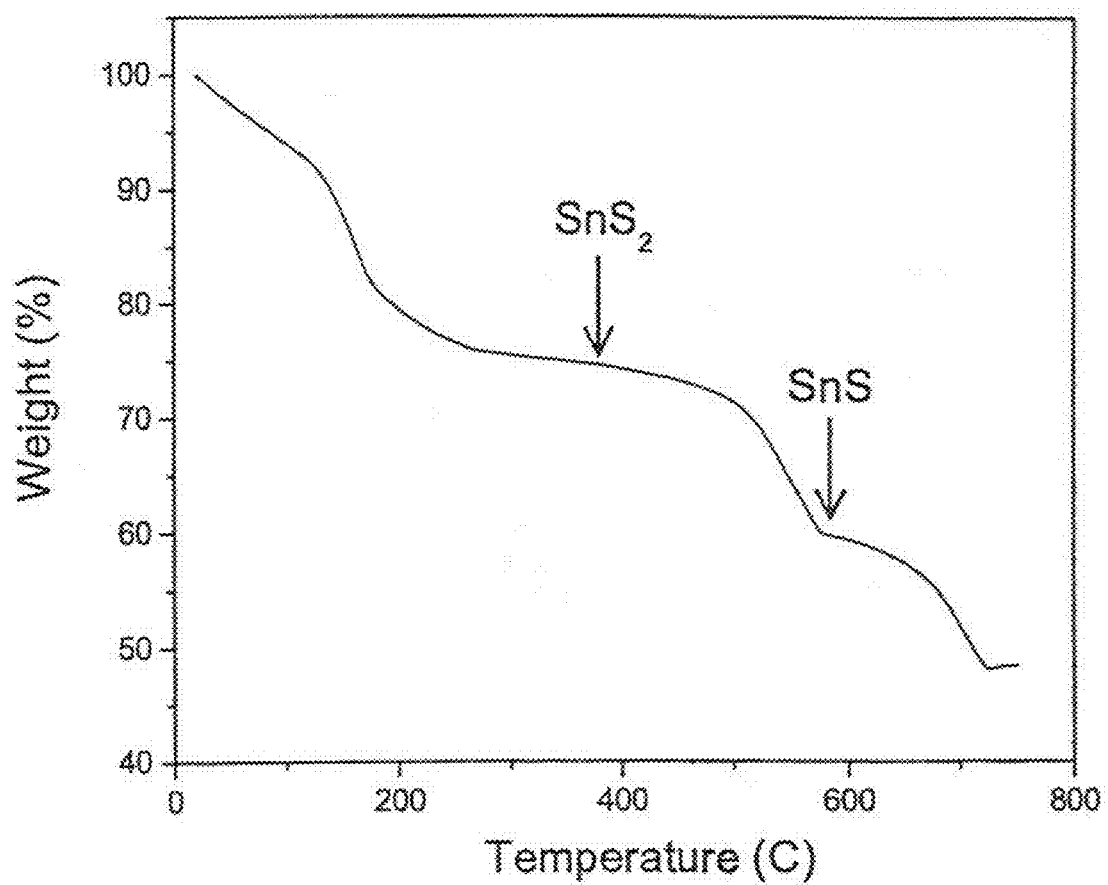
FIG. 5 depicts the Thermogravimetric Analysis (TGA) scan of the ammonium tin(IV) sulfide precursor, $(NH4)_x SnS_y$.

FIG. 5 depicts the Thermogravimetric Analysis (TGA) scan of the ammonium tin(IV) sulfide precursor, $(NH4)_xSnS_y$, run at 2° C./min to 800° C. in flowing nitrogen.

Figure 6:
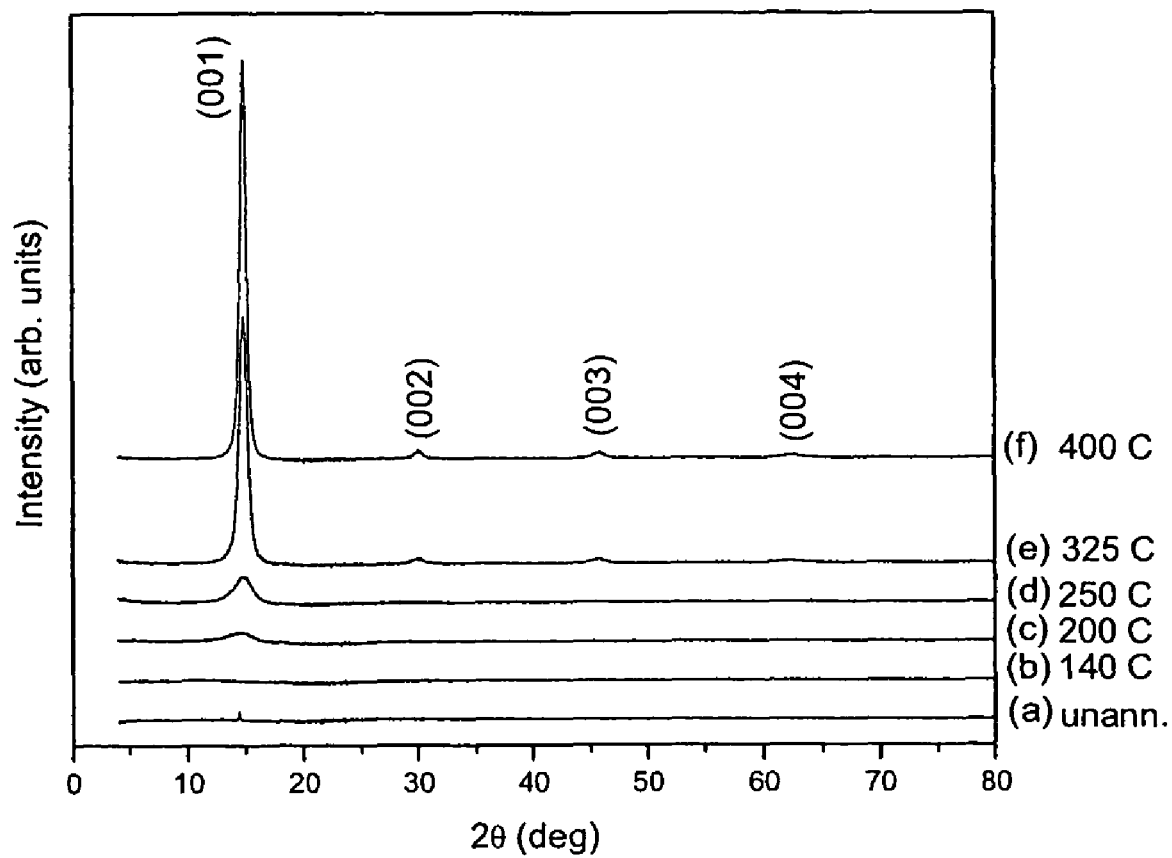
FIG. 6 depicts the X-ray diffraction patterns of tin(IV) sulfide precursor films deposited by Method 2 using spin coating.

FIG. 6 depicts the X-ray diffraction patterns of tin(IV) sulfide precursor films deposited by Method 2 using spin coating and annealed at (a) unannealed, (b)140° C., (c) 200° C., (d) 250° C., (e) 325° C., (f) 400° C. The films exhibit increasing crystallinity with increasing anneal temperature, as well as substantial c-axis preferred orientation. The calculated c-axis parameter using the 400° C. film is 5.95 Å, consistent with published bulk sample values for $SnS_2$, 5.90 Å [B. Palosz et al., J. Appl. Crystallogr. 22, 622 (1989)].

Figure 7:
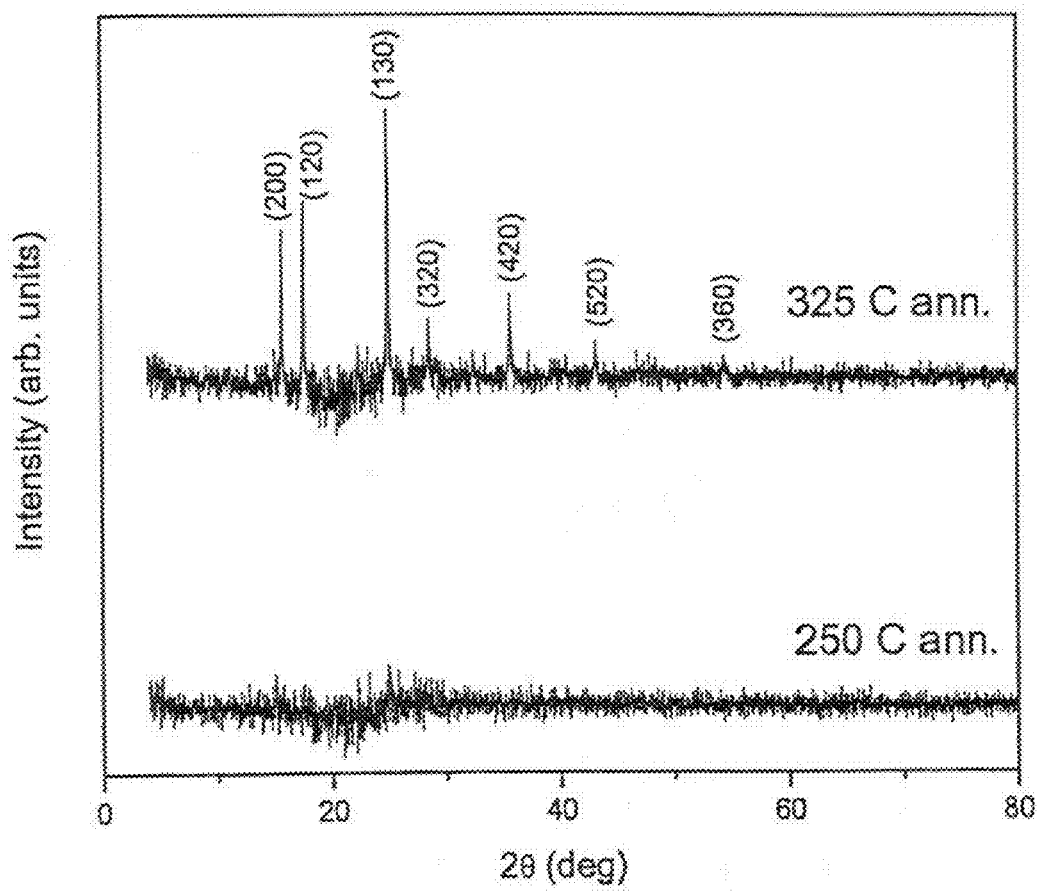
FIG. 7 depicts X-ray diffraction patterns of antimony(III) sulfide precursor films deposited by Method 2 using spin coating.

FIG. 7 depicts the X-ray diffraction patterns of antimony (III) sulfide precursor films deposited by Method 2 using spin coating and annealed at (a) 250° C. and (b) 325° C. The reflection indices, based on a published structure report for $Sb_2S_3$, are given in the figure [D. Nodland et al., North Dakota State University, Fargo, N.Dak., USA, ICDD Grant-in-Aid (1990)].

Figure 8:
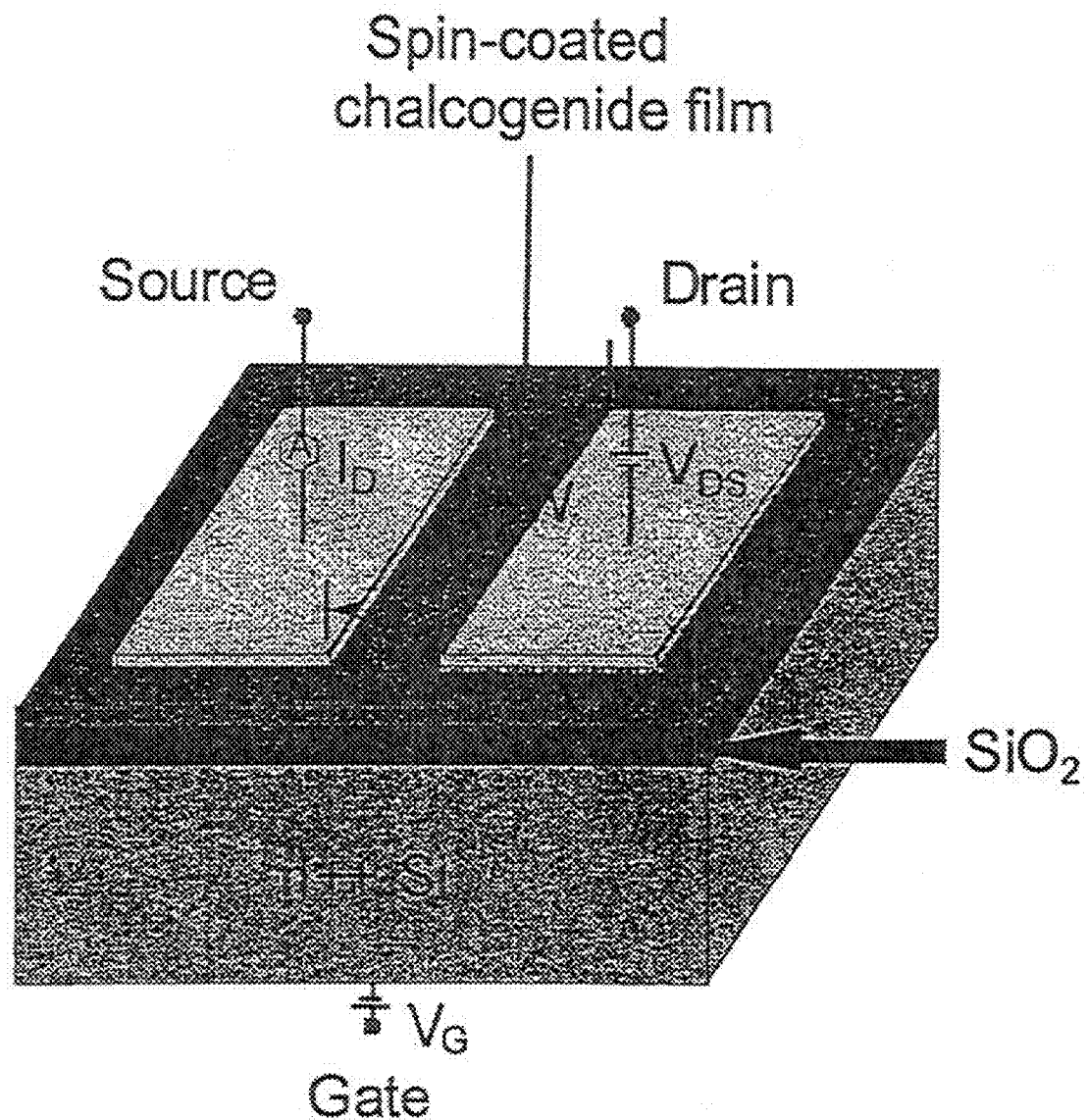
FIG. 8 is a Schematic diagram of a TFT device structure employing a spin-coated metal chalcogenide semiconductor as the channel material.

FIG. 8 is a Schematic diagram of a TFT device structure employing a spin-coated metal chalcogenide semiconductor as the channel material.

Figure 9:
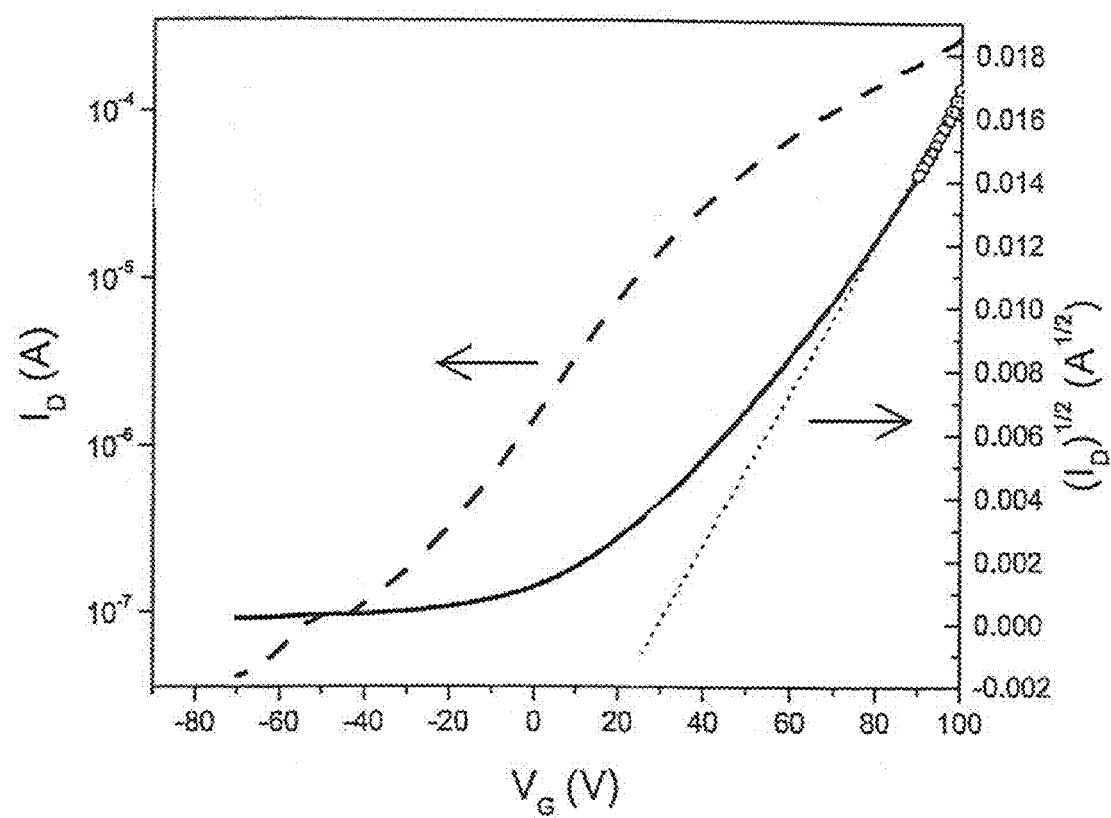
FIG. 9 depicts plots of $I_D$ and $I_D^{1/2}$ versus $V_G$ at constant $V_D=100$ V for a TFT with a spin-coated $SnS_2$ channel fabricated using Method 1.

FIG. 9 depicts the Plots of $I_D$ and $I_D^{1/2}$ versus $V_G$ at constant $V_D$=100 V, used to calculate current modulation, $I_{on}/I_{off}$, and saturation-regime field-effect mobility, μ, for a TFT with a spin-coated $SnS_2$ channel of length L=25 μm and width W=1500 μm, fabricated using Method 1. The gate dielectric is 3000 Å $SiO_2$.

Figure 10:
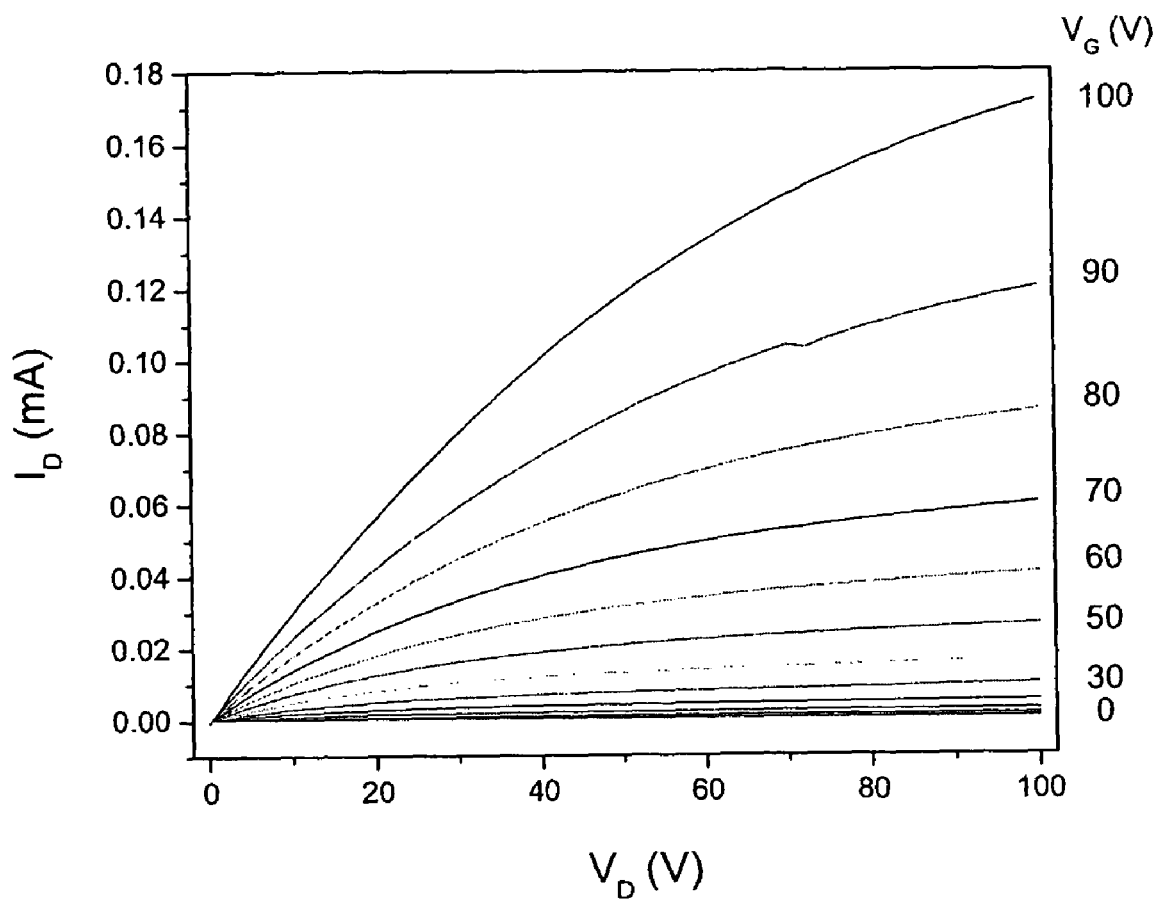
FIG. 10 depicts plots of Drain current, $I_D$, versus source-drain voltage, $V_D$, as a function of the gate voltage, $V_G$, for a TFT with a spin-coated $SnS_2$ channel fabricated using Method 1.

FIG. 10 depicts plots of Drain current, $I_D$, versus source-drain voltage, $V_D$, as a function of the gate voltage, $V_G$, for a TFT with a spin-coated $SnS_2$ channel of length L=25 μm and width W=1500 μm, fabricated using Method 1. The gate dielectric is 3000 Å $SiO_2$.

Figure 11:
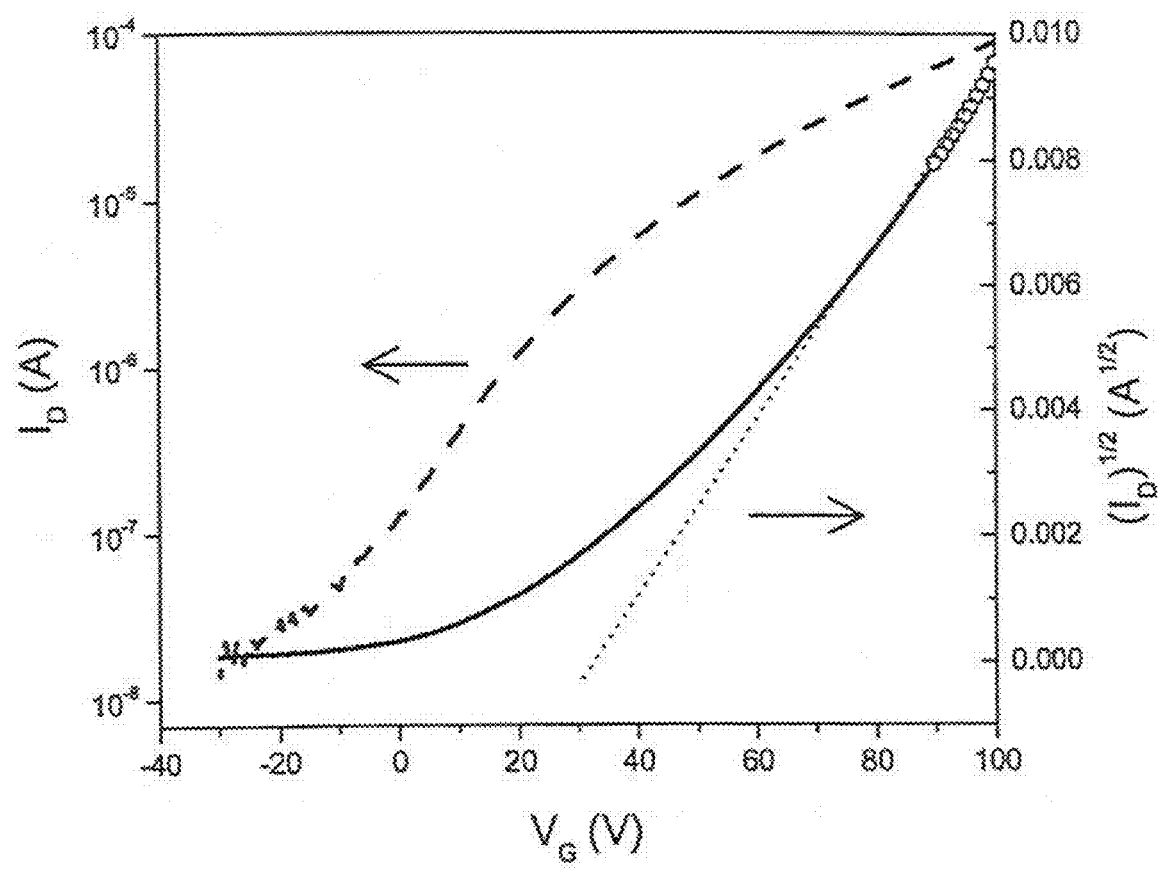
FIG. 11 depicts plots of $I_D$ and $I_D^{1/2}$ versus $V_G$ at constant $V_D=100$ V for a TFT with a spin-coated $SnS_2$ channel fabricated using Method 2.

FIG. 11 depicts plots of $I_D$ and $I^{D1/2}$ versus $V_G$ at constant $V_D$=100 V, used to calculate current modulation, $I_{on}/I_{off}$, and saturation-regime field-effect mobility, μ, for a TFT with a spin-coated $SnS_2$ channel of length L=25 μm and width W=1500 μm, fabricated using Method 2. The gate dielectric is 3000 Å $SiO_2$.

Figure 12:
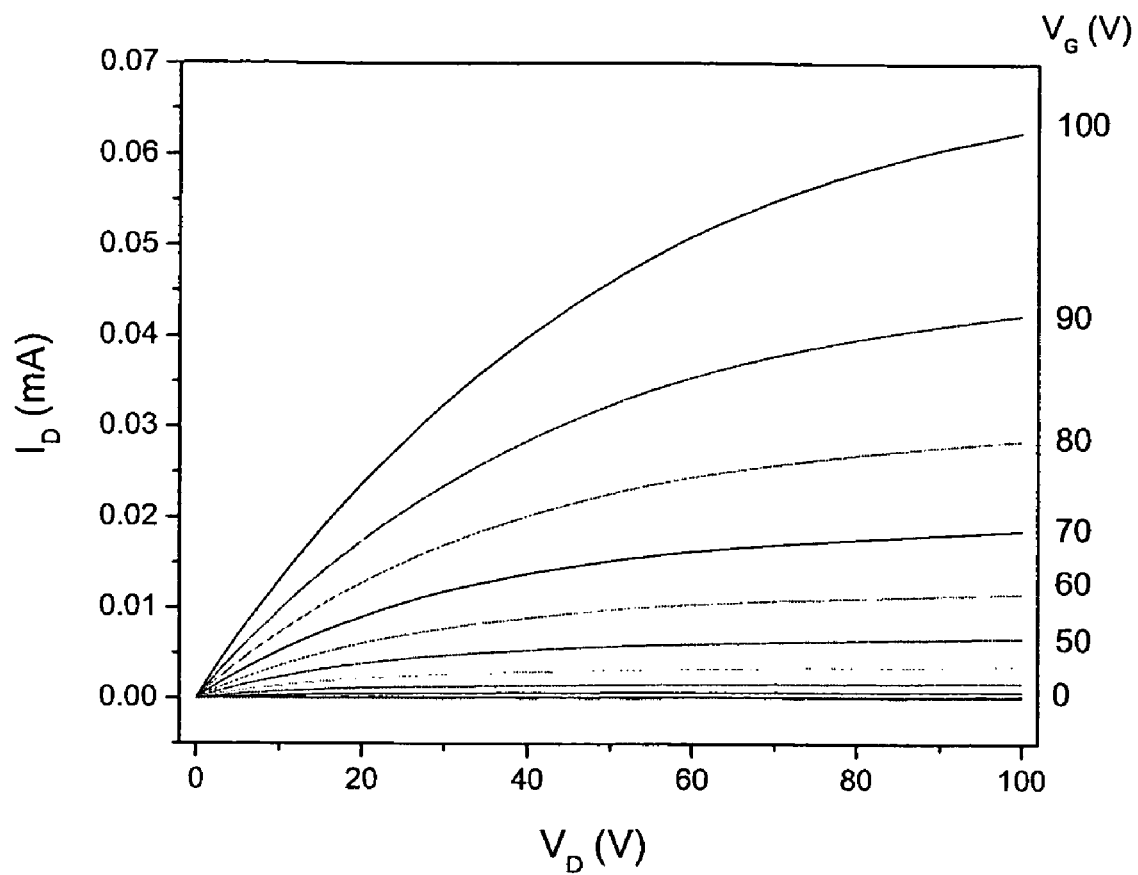
FIG. 12 depicts plots of drain current, $I_D$, versus source-drain voltage, $V_D$, as a function of the gate voltage, $V_G$, for a TFT with a spin-coated $SnS_2$ channel fabricated using Method 2.

FIG. 12 depicts plots of drain current, $I_D$, versus source-drain voltage, $V_D$, as a function of the gate voltage, $V_G$, for a TFT with a spin-coated $SnS_2$ channel of length L=25 μm and width W=1500 μm, fabricated using Method 2. The gate dielectric is 3000 Å $SiO_2$.

Figure 13:
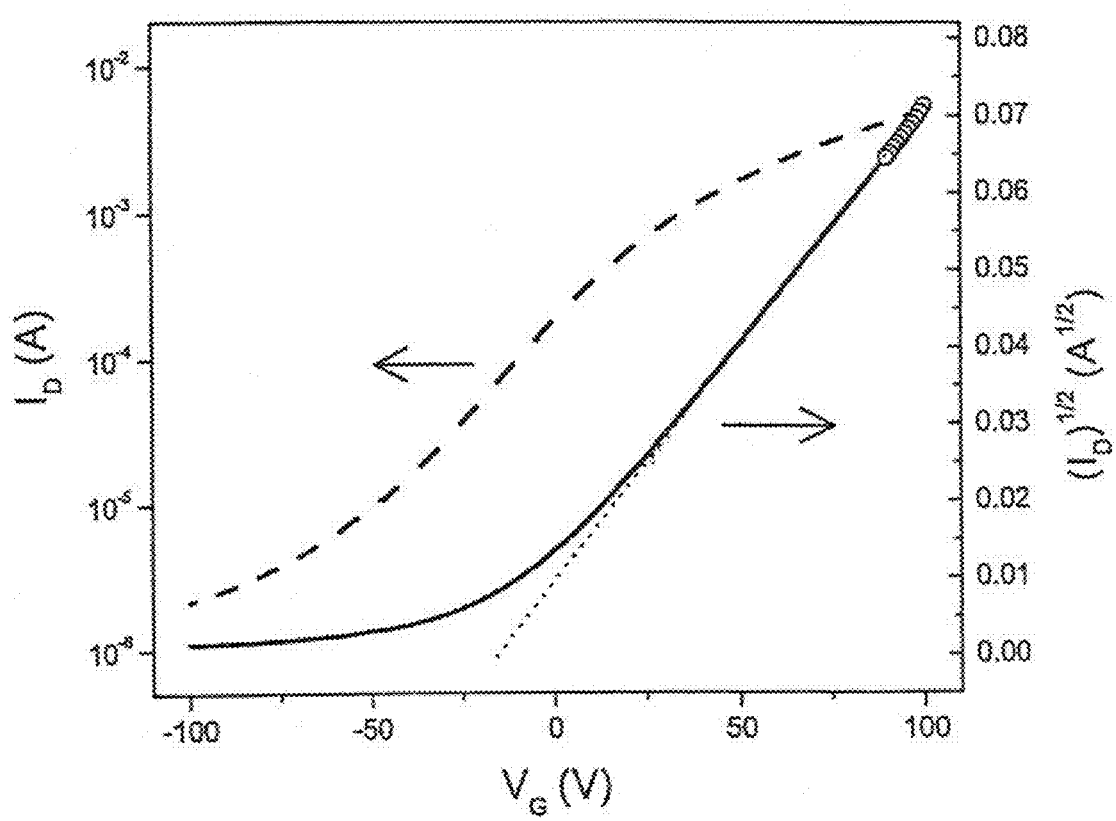
FIG. 13 depicts plots of $I_D$ and $I_D^{1/2}$ versus $V_G$ at constant $V_D=100$ V, for a TFT with a spin-coated $SnSe_{2-x}S_x$ channel fabricated using Method 2.

FIG. 13 depicts plots of $I_D$ and $I_D^{1/2}$ versus $V_G$ at constant $V_D$=100 V, used to calculate current modulation, $I_{on}/I_{off}$, and saturation-regime field-effect mobility, μ, for a TFT with a spin-coated $SnSe_{2-x}S_x$ channel of length L=25 μm and width W=1500 μm, fabricated using Method 2. The gate dielectric is 3000 Å $SiO_2$.

Figure 14:
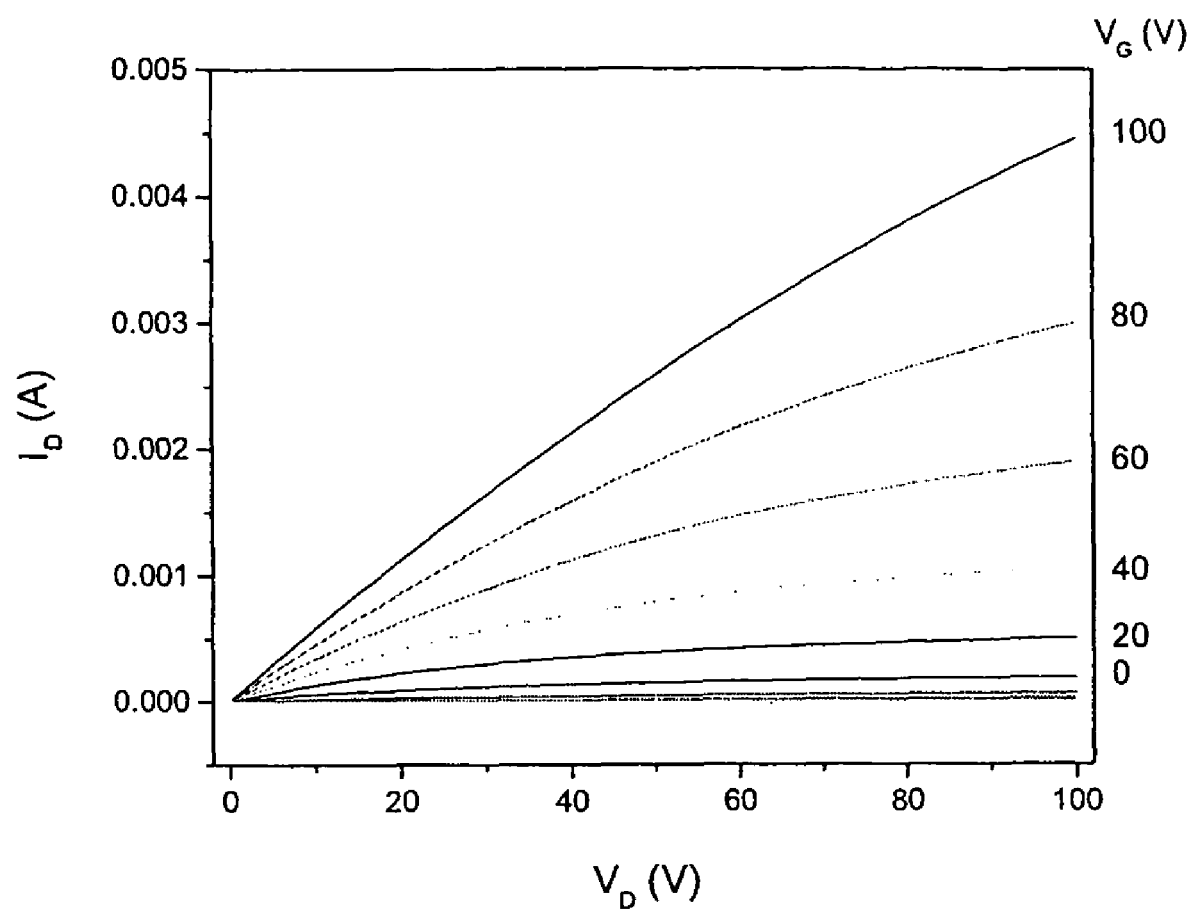
FIG. 14 depicts plots of drain current, $I_D$ versus source-drain voltage, $V_D$ as a function of the gate voltage, $V_G$, for a TFT with a spin-coated $SnSe_{2-x}S_x$ channel fabricated using Method 2.

FIG. 14 depicts plots of drain current, $I_D$, versus source-drain voltage; $V_D$, as a function of the gate voltage, $V_G$, for a TFT with a spin-coated SnSe$_{2-x}$S$_x$ channel of length L=25 μm and width W=1500 μm, fabricated using Method 2. The gate dielectric is 3000 Å SiO$_2$.

Figure 15:
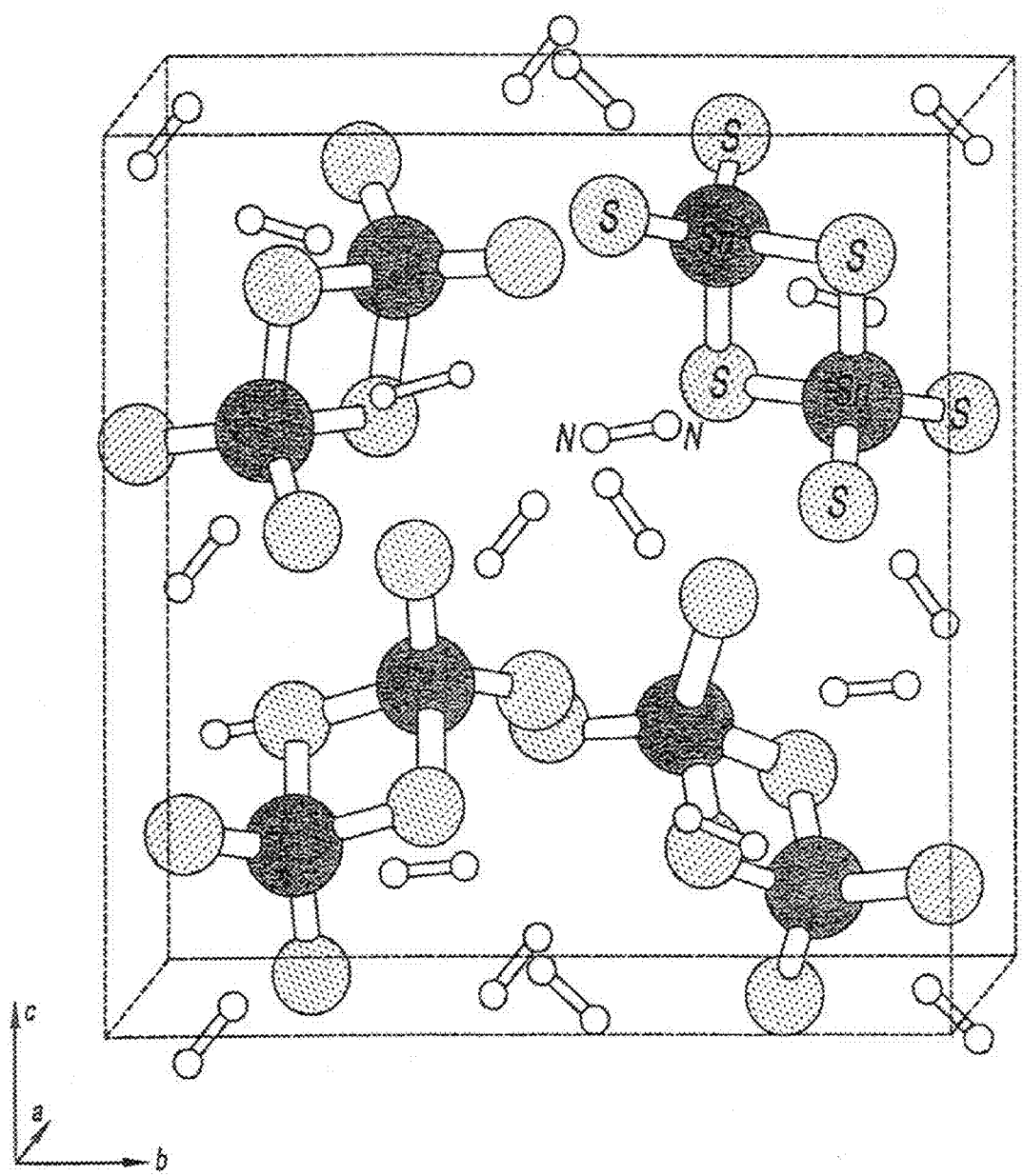
FIG. 15 depicts the crystal structure of the hydrazinium precursor, $(N_2H_5)_4Sn_2S_6$, determined using single crystal X-ray diffraction.

FIG. 15 depicts the crystal structure of the hydrazinium precursor, (N$_2$H$_5$)$_4$Sn$_2$S$_6$, determined using single crystal X-ray diffraction. Hydrogen atoms have been removed for clarity. Unit cell (outlined by dashed lines): Orthorhombic (P 2$_1$ 2$_1$ 2$_1$), a=8.5220(5) A, b=13.6991 (8) A, c=14.4102 (9) A, V=1682.301A$^3$, and Z=4.

Figure 16:
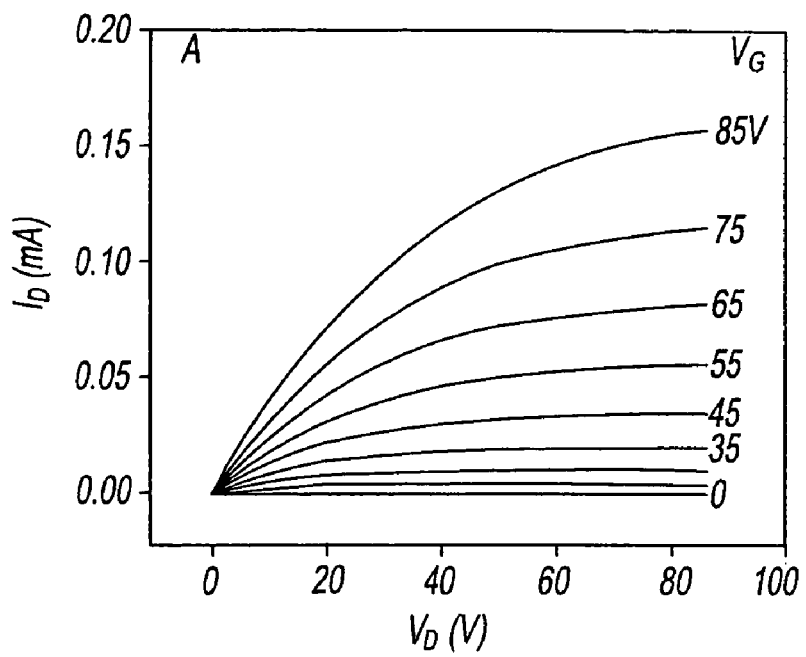
FIG. 16 shows the device characteristics for spin-coated $SnS_2$ channel with a channel length L=95 μm and channel width W=1500 μm fabricated using Method 3. Drain current, $I_D$, versus source-drain voltage, $V_D$, as a function of gate voltage $V_G$.

FIG. 16 shows the device characteristics for spin-coated SnS$_2$ channel with a channel length L=95 μm and channel width W=1500 μm fabricated using Method 3. The gate dielectric is 2500 Å SiO$_2$. Drain current, I$_D$, versus source-drain voltage, V$_D$, as a function of gate voltage V$_G$.

Figure 17:
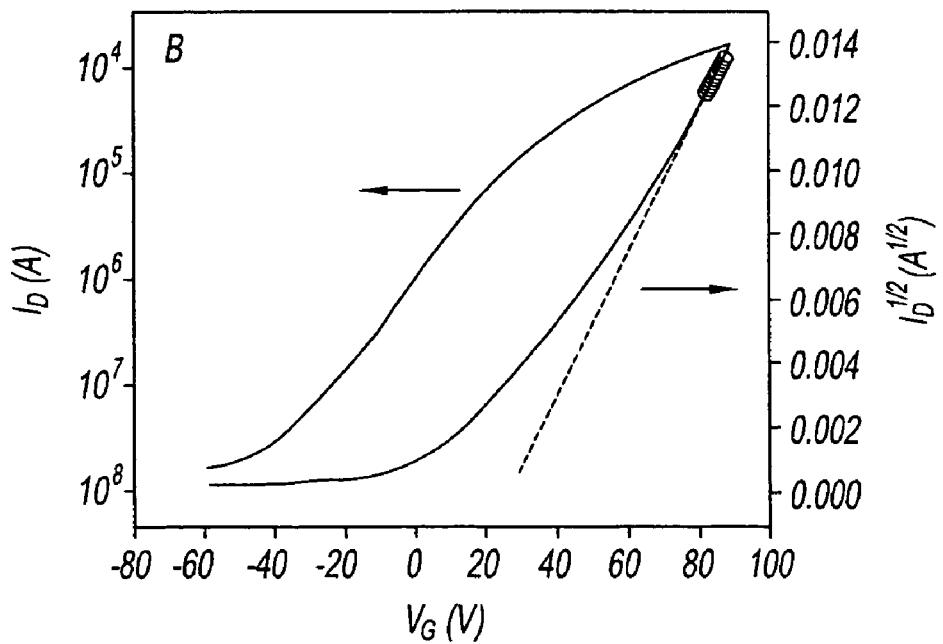
FIG. 17 shows the device characteristics for spin-coated $SnS_2$ channel with a channel length L=95 μm and channel width W=1500 μm fabricated using Method 3. Plots of $I_D$ and $I_D^{1/2}$ versus $V_G$ at constant $V_D=85V$, used to calculate current modulation, $I_{ON}/I_{OFF}$, and saturation regime mobility, $\mu_{sat}$, for the tin sulfide channel.

FIG. 17 shows the device characteristics for spin-coated SnS$_2$ channel with a channel length L=95 μm and channel width W=1500 μm fabricated using Method 3. The gate dielectric is 2500 Å SiO$_2$. Plots of I$_D$ and I$_D^{1/2}$ versus V$_G$ at constant V$_D$=85V, used to calculate current modulation, I$_{ON}$/I$_{OFF}$, and saturation regime mobility, μ$_{sat}$, for the tin sulfide channel.

Figure 18:
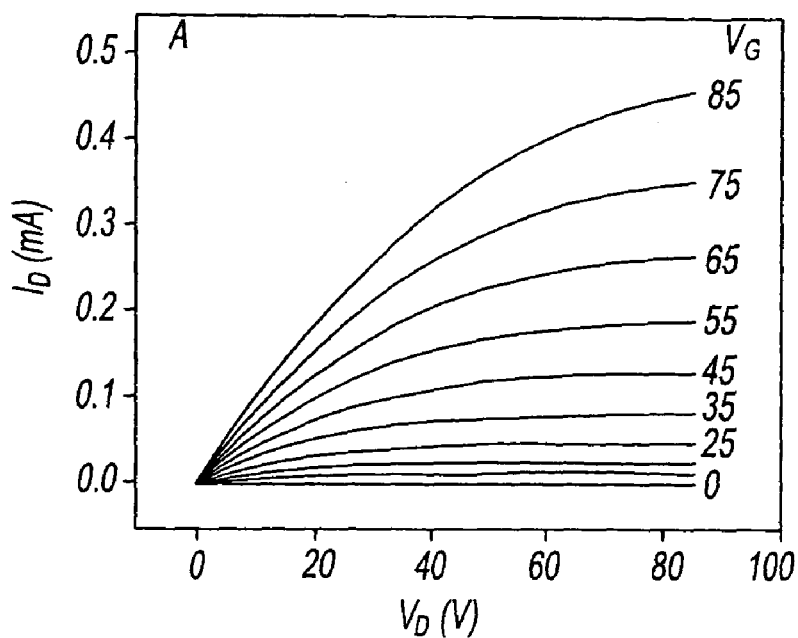
FIG. 18 shows device characteristics for spin-coated $SnS_{2-x}Se_x$ channel with a channel length L=95 μm and channel width W=1000 μm fabricated using Method 3. Drain current, $I_D$, versus source-drain voltage, $V_D$, as a function of gate voltage, $V_G$.

FIG. 18 shows device characteristics for spin-coated SnS$_{2-x}$Se$_x$ channel with a channel length L=95 μm and channel width W=1000 μm fabricated using Method 3. The gate dielectric is 2500 Å SiO$_2$. Drain current, I$_D$, versus source-drain voltage, V$_D$, as a function of gate voltage, V$_G$.

Figure 19:
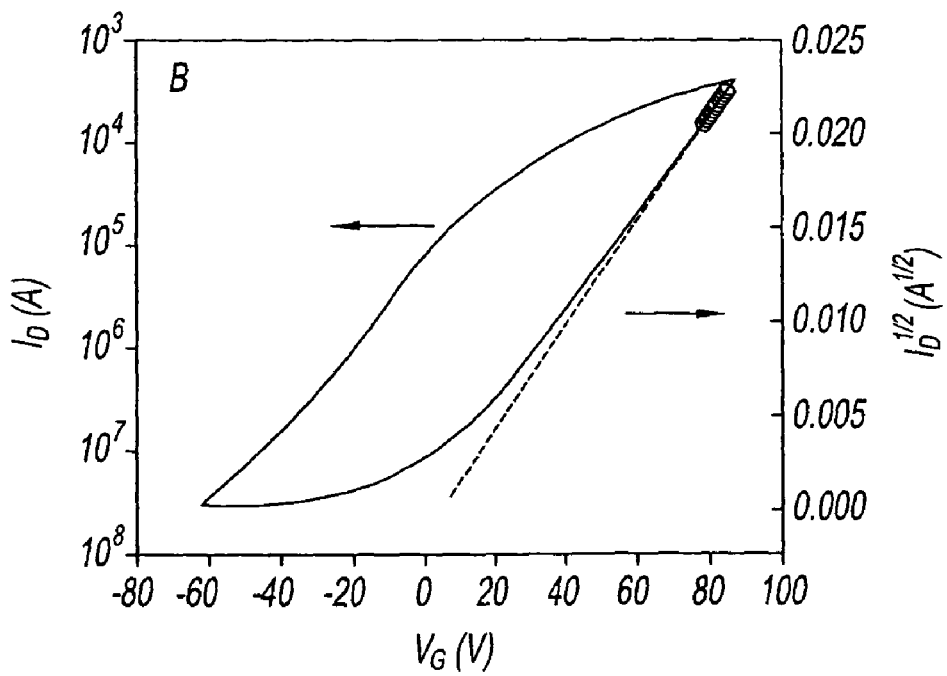
FIG. 19 shows device characteristics for spin-coated $SnS_{2-x}Se_x$ channel with a channel length L=95 μm and channel width W=1000 μm fabricated using Method 3.

FIG. 19 shows device characteristics for spin-coated SnS$_{2-x}$Se$_x$ channel with a channel length L=95 μm and channel width W=1000 μm fabricated using Method 3. The gate dielectric is 2500 Å SiO$_2$. Plots of I$_D$ and I$_D^{1/2}$ versus V$_G$ at constant V$_D$=85V, used to calculate current modulation, I$_{ON}$/I$_{OFF}$, and saturation regime mobility, μ$_{sat}$, for the SnS$_{2-x}$Se$_x$ channel.

Figure 20:
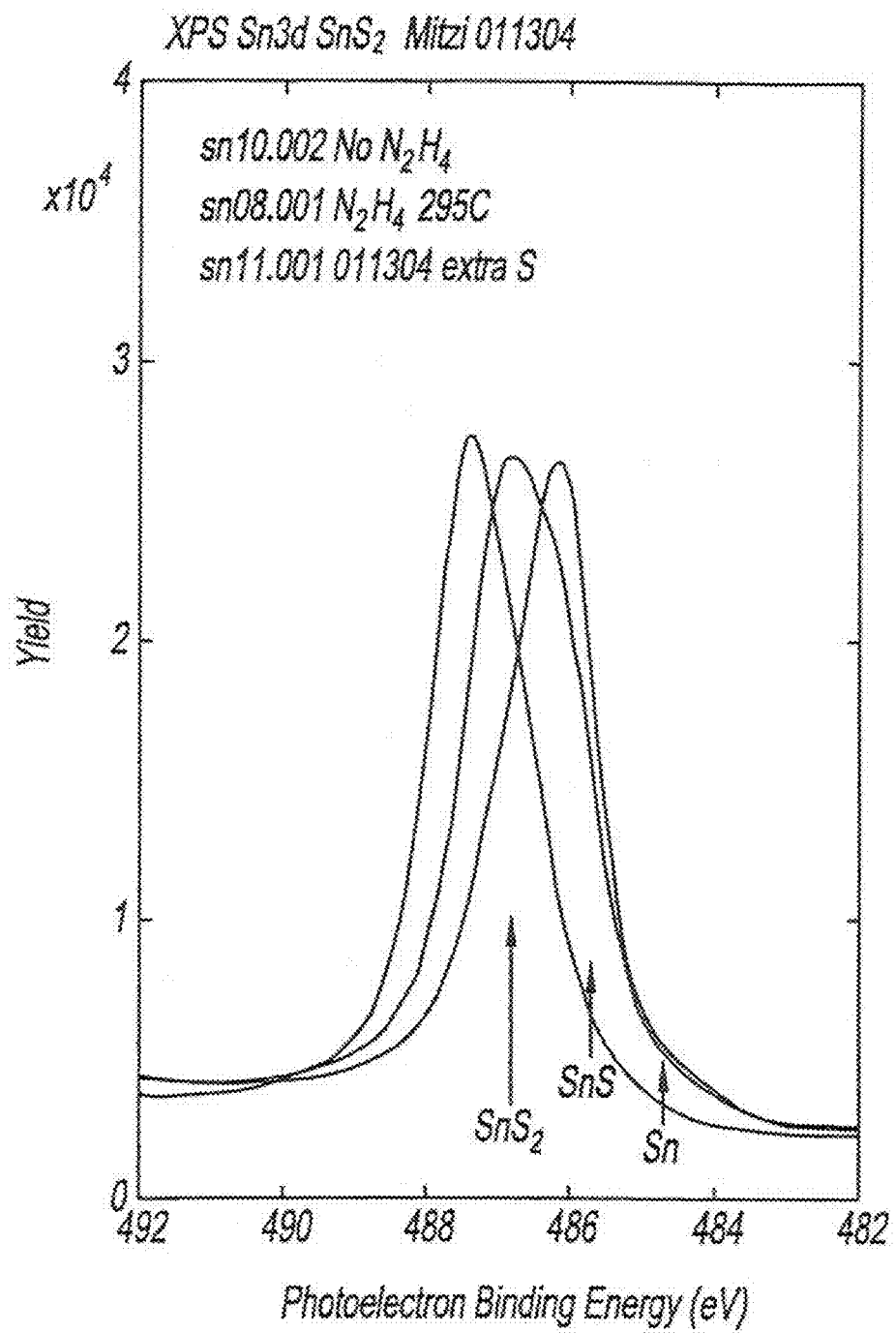
FIG. 20 shows X-ray photoemission spectroscopy (XPS) results. The Sn valency appears to change with the metal/chalcogenide ratio. As the S/Sn ratio is varied from 1.55 to 2.02, the Sn3d core level binding energy shifts from 486.3 eV to 487.2 eV corresponding to a decrease in Sn(II) valency and an increase in Sn(IV) valency. A film grown with insufficient S content has metallic rather than semiconducting characteristics.

FIG. 20 shows the X-ray photoemission spectroscopy (XPS) results. The Sn valency appears to change with the metal/chalocogenide ratio. As the S/Sn ratio is varied from 1.55 to 2.02, the Sn3d core level binding energy shifts from 486.3 eV to 487.2 eV, corresponding to a decrease in Sn(II) valency and an increase in Sn(IV) valency. A film grown with insufficient S content has metallic rather than semiconducting characteristics.

It is important to obtain the correct metal/chalcogenide ratio in the precursor solution. Insufficient quantities of chalocogenide will render the film excessively conductive. For example, a film grown with insufficient S content has more metallic rather than semiconducting characteristics.

This can be seen in the Sn core level binding energy measured with x-ray photoemission, which is an indicator of the valency of the Sn. If we examine the Sn3d spectra of a film processed with a conventional hydrizinium precursor, i.e., with hydrazine as the solvent, we see a broad peak centered at 486.6 eV binding energy (FIG. 20).

A film grown using the present invention without extra S has a core level binding energy of 486.3 eV, which moves to 487.2 eV if additional S is used. The shift in binding energy indicates a trend from Sn(II) valency towards Sn(IV) valency, with the more highly ionized species at a higher binding energy. We conclude that the addition of S has reduced the quantity of SnS and increased the SnS2 content of the film.

MEIS determination of the S/Sn ratio for these films also indicate a trend towards improved stoichiometry that correlates with the XPS results. The films labeled "no N2H4" are fabricated using the methods of the present invention.

| Film | S/Sn |
|---|---|
| No N2H2 (sn10) | 1.55 |
| N2H2 (sn08) | 1.8 |
| No N2H2 extra S (sn11) | 2.02 |

The present invention provides a new method of solution-depositing chalcogenide-based electronic materials in the form of high-quality thin films for application in electronic devices. Ability to deposit from solution is particularly attractive since it opens the opportunity to employ a number of low-cost; low-temperature, relatively quick techniques such as spin-coating, printing, stamping, and dipping. While the discussion presented below primarily refers to the application of these films in TFT's, this discussion is meant to be representative, and the electronic films so deposited could equally be used in other electronic devices as well.

Illustrative examples of the preparation of films of metal chalcogenide semiconducting materials and TFT devices thereof are provided below.

METHOD 1

Example 1

A solution of SnS$_2$ was formed by dissolving 0.274 g SnS$_2$ (1.5 mmol) in 1.0 ml hydrazine and 0.048 g sulfur (1.5 mmol). Substantial bubbling is observed during the dissolution process, presumably as a result of evolution of primarily nitrogen during the reaction. The dissolution is somewhat slow at room temperature, requiring approximately 4-6 hours of stirring to produce a clear yellow solution. The solution was filtered and the filtrate was evaporated under a flow of nitrogen gas, ultimately yielding 0.337 g of yellow powder. Thermal analysis of the powder indicates that the resulting solid decomposes to form SnS$_2$ at a relatively low temperature, essentially by 200° C., with a weight loss of 38% observed during the process (FIG. 1).

A film of the above-described precursor can readily be deposited on a cleaned quartz substrate by dissolving 0.055 g SnS$_2$ (0.3 mmol) in 0.5 ml hydrazine and 0.010 g sulfur (0.3 mmol). Each substrate was precleaned sequentially in aqua regia, toluene, methanol and ultimately in a concentrated aqueous ammonium hydroxide solution. Thin films of SnS$_2$ are formed by depositing 3-4 drops of the above-mentioned SnS$_2$ solution onto the substrate, allowing the substrate/solution to sit for 20 min to improve the wetting, and spinning the substrate at 2000 rpm for 2 min in air. The resulting yellow films are annealed 300° C. for 10 minutes in an inert atmosphere. X-ray patterns for the resulting film are shown in FIG. 2 and indicate a crystalline film of SnS$_2$.

Example 2

SnSe$_2$ films were also deposited using the above-described technique.

0.277 g SnSe$_2$ (1 mmol) was readily dissolved (in several minutes, with stirring) in 1 ml hydrazine when 0.079 g Se (1 mmol) have been added, yielding ultimately a light yellow solution. The light yellow coloration suggests the lack of formation of polychalcogenides during the process although if larger quantities of Se are added, a darker coloration of the solution is observed. Substantial bubbling is observed during the dissolution process, presumably as a result of evolution of primarily nitrogen during the reaction. Evaporating the solution under flowing nitrogen gas over the period of several hours leads to the formation of approximately 0.450 g of a yellow crystalline powder. The powder rapidly loses weight while sitting on a balance at room temperature, suggesting incorporation of solvent (i.e., hydrazine) within the structure, which slowly dissociates from the sample.

Single crystal structure refinement on a crystal collected from the product (FIG. 3) has composition $(N_2H_4)_3(N_2H_5)_4$ $Sn_2Se_6$ and a structure including $Sn_2Se_6^{4-}$ dimers alternating with hydrazinium cations and neutral hydrazine molecules. Note that the structure of the product supports the mechanism drawn out in equations (1) and (2).

Thin films of $SnSe_2$ are formed by depositing 3 drops of the above-mentioned $SnSe_2$ solution onto a substrate (e.g., quartz), allowing the substrate/solution to sit for 20 min to improve the wetting, and spinning the substrate at 2000 rpm for 2 min. The resulting yellow films are annealed at 225° C., 250° C., 275° C., and 300° C. for 10 minutes in an inert atmosphere. X-ray patterns for the resulting films are shown in FIG. 4, indicating increased crystallinity with increasing anneal temperature. However, even at the low temperatures (i.e., <<300° C.), crystalline films can be prepared. The X-ray diffraction pattern is in agreement with that for $SnSe_2$, and additionally indicates substantial preferred orientation.

Films of $SnSe_{2-x}S_x$ ($x \approx 1$) have similarly been prepared starting with $SnS_2$, $SnSe_2$, S, Se and hydrazine, respectively.

METHOD 2

In accordance with the second method of the present invention for the preparation of a metal chalcogenide solution, an ammonium metal chalcogenide precursor can be prepared, depending on the metal chalcogenide under consideration, by any suitable technique including a simple dissolution of the metal chalcogenide in an ammonium chalcogenide aqueous solution followed by evaporation of the solution at room temperature, solvothermal techniques and by solid-state routes at elevated temperatures.

Example 3

In this example, the ammonium-based tin(IV) sulfide precursor was synthesized by dissolving 548.5 mg of $SnS_2$ (3 mmol) in 85 ml of 50 wt. % aqueous ammonium sulfide, $(NH_4)_2S$, over a period of 4 days. The solution was filtered through a 0.45 μm glass microfiber filter and the resulting filtered solution was slowly evaporated under a flow of nitrogen gas over a period of several days; leading to a yellow product (~1.05 g).

The product was repeatedly washed filtered with methanol until the resulting filtrate was colorless and the thermal analysis scan on the final product yields a weight-loss transition at ~150° C. (to yield $SnS_2$) of approximately 30% (FIG. 5). This indicates an approximate composition, $(NH_4)_2SnS_3$. The product is nominally amorphous, i.e., no X-ray pattern is observed in a powder diffractometer. The weight loss, which corresponds to loss of ammonia and hydrogen sulfide, is initiated at temperatures as low as ambient temperature, indicating the ease with which the material can be decomposed to $SnS_2$. Because the $SnS_2$ precursor need not have a fixed stoichiometric ratio, the precursor is referred to herein as $(NH_4)_xSnS_y$.

The precursor, $(NH_4)_xSnS_y$, was found to be highly soluble in hydrazine. For example, 80 mg of $(NH_4)_xSnS_y$ can be easily dissolved in 0.5 ml anhydrous hydrazine, with vigorous evolution of ammonia. Accordingly, films can be conveniently spin-coated on quartz disks from the above mentioned hydrazine solution, either in an inert atmosphere drybox or in air, using approximately 3-4 drops of the precursor solution on each 0.75 inch quartz disk substrate and spinning at, for example, 2000 rpm for 2 minutes.

Each substrate was precleaned sequentially in aqua regia, toluene, methanol and ultimately in a concentrated aqueous ammonium hydroxide solution. The resulting film was light yellow in color (transparent) and very smooth in appearance.

Five annealing temperatures were considered: 140° C., 200° C., 250° C., 325° C., 400° C. For each temperature, the coated substrate was annealed at the prescribed temperature for 20 minutes on a temperature-controlled hot plate in an inert (nitrogen) atmosphere. X-ray studies of films indicate progressively improving crystallinity with increasing annealing temperature (FIG. 6), although some crystallinity is noted at temperatures even as low as 200° C.

Example 4

As a second example of the ammonium-precursor technique, films of $Sb_2S_3$ were prepared.

The ammonium-based antimony(III) sulfide precursor was synthesized by dissolving 0.250 g of $Sb_2S_3$ (0.74 mmol) in 10 ml of 50 wt. % aqueous ammonium sulfide, $(NH_4)_2S$, over a period of several hours. The solution was filtered through a 0.45 μm glass microfiber filter and the resulting filtered solution was slowly evaporated under a flow of nitrogen gas over a period of 3 hours, leading to a darkly-colored product (~0.385 g). The precursor, $(NH_4)_xSbS_y$, was found to be highly soluble in hydrazine. For example, 80 mg of $(NH_4)_xSnS_y$ can be easily dissolved in 0.5 ml anhydrous hydrazine, with vigorous evolution of ammonia. Films can therefore be conveniently spin-coated on quartz disks from the above mentioned-hydrazine solution, either in an inert atmosphere dry box or in air, using approximately 3-4 drops of the precursor solution on each 0.75 inch quartz disk substrate and spinning, for example, at 2000 rpm for 2 minutes.

Each substrate was precleaned sequentially in aqua regia, toluene, methanol and ultimately in a concentrate ammonium hydroxide solution. The resulting film was lightly colored (transparent) and very smooth in appearance.

Two annealing temperatures were considered: 250° C. and 325° C. For each temperature, the coated substrate was annealed at the prescribed temperature for 20 minutes on a temperature-controlled hot plate in an inert (nitrogen) atmosphere. Upon placing the substrate on the hot plate, the color of the film immediately darkened, indicating the formation of $Sb_2S_3$. X-ray study of films indicates progressively improving crystallinity with increasing annealing temperature (FIG. 7).

Example 5

TFT Device:

TFT's were prepared, using the semiconducting metal chalcogenides described above as the semiconducting channel. For testing purposes, the devices tested include a heavily n-doped silicon substrate (which also acts as the gate), 3000 Å thermally grown $SiO_2$ insulating barrier layer, a spin-coated tin(IV) sulfide or selenide channel layer, and patterned 800 Å gold source and drain electrodes (FIG. 8).

For $SnS_2$ semiconducting channels, the spin-coating solution was prepared by either Method 1, i.e., dissolving 20 mg $SnS_2$ (0.11 mmol) in 1.6 ml hydrazine and 3.5 mg S (0.11 mmol), or Method 2, i.e., dissolving 25 mg of the ammonium precursor, $(NH_4)_xSnS_y$, in 1.6 ml hydrazine. In either case, 3-4 drops of the tin(IV) sulfide solution are placed on cleaned 2 cm×2 cm silicon substrates (with the final cleaning step included of placing the substrates in ammonium hydroxide for at least ½ hr) and spun in air at 3500 rpm for 1 min. The annealing sequence for the Method 1 film includes a gradual ramp to 120° C., a dwell at 120° C. for 20 min, and finally an anneal at 300° C. for approximately 5 min. The film received a second anneal at 300° C. after deposition of the gold source and drain contacts, which substantially improved device characteristics.

The annealing sequence for the Method 2 film includes a gradual ramp to 120° C., a dwell at 120° C. for 20 min, and finally an anneal at 300° C. for approximately 15 min. Drain and gate sweep characteristics for the $SnS_2$ channels produced using Method 1 or 2 are shown in FIGS. 9-12.

The device characteristics for the devices made using Method 1 are $\mu_{sat}$=0.20 cm$^2$/V-sec, $\mu_{lin}$=0.10 cm$^2$/V-sec, and $I_{on}/I_{off}$=7×10$^3$, while for Method 2 the values are $\mu_{sat}$=0.07 cm$^2$/V-sec, $\mu_{lin}$=0.05 cm$^2$/V-sec, and $I_{on}/I_{off}$=6×10$^3$.

Example 6

Films of a mixed $SnSe_{2-x}S_x$ type were also made using Method 2.

The ammonium precursor was synthesized by dissolving 0.360 g $SnSe_2$ (1.3 mmol) in 56 ml of 50 wt. % aqueous ammonium sulfide, $(NH_4)_2S$, over a period of several days. The solution was filtered through a 0.45 µm glass microfiber filter and the resulting filtered solution was slowly evaporated under a flow of nitrogen gas over a period of several days. The darkly-colored product was rinsed thoroughly with methanol, yielding 0.477 g of a darkly-colored product. The tin(IV) selenide/sulfide precursor layer was prepared by dissolving 30 mg of the precursor in 1.6 ml hydrazine and spinning 3-4 drops placed on the substrate at 3500 rpm for 1 min.

The oxide-coated silicon substrates were cleaned thoroughly and dipped in an ammonium hydroxide solution for at least an hour before spin coating of the metal chalcogenide solution. The annealing sequence for the films includes a gradual ramp to 120° C., a dwell at 120° C. for 20 min, and finally an anneal at 300° C. for approximately 15 min.

Device properties are shown in FIGS. 13 and 14, yielding at $\mu_{sat}$=1.3 cm$^2$/V-sec, $\mu_{lin}$=1.0 cm$^2$/V-sec, and $I_{on}/I_{off}$=10$^3$, some of the highest reported values for mobility for an n-type spin-coated semiconductor.

METHOD 3

In the following examples, the hydrazinium precursors were isolated from the reaction mixture. Unlike Examples 1-6 in which the reaction mixtures containing hydrazine were used "as is" to cast the films, in Examples 7-9, the isolated precursors were used to cast the films.

Example 7

$SnS_2$ Films and Devices:

1. Pale yellow $(N_2H_5)_4Sn_2S_6$ crystals and powder are formed by dissolving (in a nitrogen atmosphere, over several hours, with stirring) 0.183 g of $SnS_2$ (1 mmol) in 2 ml of hydrazine and 0.064g of S (2 mmol), yielding ultimately a yellow solution.

Note that hydrazine is highly toxic and should be handled using appropriate protective equipment to prevent contact with either the vapors or liquid. Evaporating the solution to dryness under flowing nitrogen gas over the period of several hours, as well as under vacuum for several hours, leads to the formation of approximately 0.274 g (0.49 mmol) of the hydrazinium precursor $[(N_2H_5)_4Sn_2S_6]$. Chemical analysis of the product yields results consistent with expected values—observed: N(19.8%), H(3.5%); calculated: N(19.9%), H(3.6%). The crystal structure shown in FIG. 15 confirms the given chemical formula and indicates that structurally the precursor has anionic dimers of edge-sharing $SnS_4$ tetrahedra $(Sn_2S_6^{4-})$ alternating with hydrazinium cations.

2. A solution of the hydrazinium-based precursor, $(N_2H_5)_4Sn_2S_6$, was formed by stirring 14 mg of $(N_2H_5)_4Sn_2S_6$ and 3 mg S in 3.3 ml butylamine, in a nitrogen atmosphere, for approximately 12 hours. The resulting solution was clear yellow in appearance and suitable for solution processing. Note that solutions have also been demonstrated using phenethylamine and ethylenediamine as the solvent.

3. Solution processing of the thin film was accomplished by spin coating. The 2 cm×2 cm square silicon substrate was heavily n-doped, yielding a substrate resistivity <0.005 ohm-cm, and coated with approximately 2500 angstroms of thermally grown $SiO_2$ (measured capacitance=1.30×10$^{-8}$ µF/cm$^2$). The substrate was cleaned using a standard process of a soap scrub with a cotton swab, sonication in ethanol and dichloromethane, and a piranha process (hydrogen peroxide:sulfuric acid in 1:4 volume ratio). Approximately 12 drops of the above-described butylamine-based solution (stage 2), passed through a 0.2 mm filter, were placed on the cleaned silicon substrate. The solution was allowed to sit on the substrate for approximately 10 sec before initiating the spinning cycle. The spinning cycle included a ramp to 4000 rpm, 4000 rpm for 45 sec, and ramp to 0 rpm, yielding a film of the metal chalcogenide precursor. The film was further dried in air by placing the the substrate (with film on top) on a preheated hot plate at 120° C. for 5 minutes and then transferred into a nitrogen filled dry box for the final decomposition step.

4. The decomposition step was accomplished by placing the substrate (with the precursor film on top) on a preheated hot plate at 270° C. for a period of 20 minutes. The heating was performed in a nitrogen atmosphere with oxygen and water levels maintained below 1 ppm. After the heat treatment, the film was removed from the hot plate and cooled to ambient temperature, yielding a semiconducting film of tin (IV) sulfide. The stoichiometry of films, as determined using medium energy ion scattering (MEIS), was $SnS_{2.0(1)}$, entirely consistent with the expected $SnS_2$ composition. Note that films deposited from solutions in which no excess S was added (i.e., just hydrazinium precursor and butylamine) generally yielded films which were sulfur deficient, i.e., $SnS_{2-x}$, where x is approximately 0.5. This resulted in films which were too conductive and therefore inappropriate for use in TFT channel layers (i.e., they were impossible to shut off). TFT Device:

A thin film transistor was demonstrated by depositing gold source and drain electrodes on top of the semiconducting film described in stage 4. The configuration of the device is shown in FIG. 8. A representative plot of drain current, $I_D$, versus drain voltage, $V_D$, is shown in FIG. 16 as a S function of the applied gate voltage, $V_G$, for a TFT with a tin sulfide channel formed using the stages 1-4 described above. The device operates as an n-channel transistor, operating in accumulation mode upon application of a positive gate bias. Application of a negative gate bias depletes the channel of electrons and shuts the device off. At low $V_D$, the TFT shows typical transistor behavior as $I_D$ increases linearly with $V_D$. Current saturation, with a small ohmic component, is observed at high $V_D$ as the accumulation layer is pinched off near the drain electrode. Current modulation ($I_{ON}/I_{OFF}$) and saturation regime field-effect mobility ($\mu_{sat}$) are calculated from the plot of $I_D$ and $I_D^{1/2}$ versus $V_G$ (FIG. 17), yielding $I_{ON}/I_{OFF}$=10$^4$ and $\mu_{sat}$=0.4 cm$^2$/V-s, respectively, for a −60 to 85 V gate sweep and V$_D$=85 V. Note that use of a thinner or higher dielectric constant gate insulator (relative to the 2500 Å SiO$_2$ layer currently used) is expected to enable significant reduction in the device operating voltage. The linear regime mobility derived from the plots in FIG. 16, $\mu_{lin}$=0.38 cm$^2$/V-s, is very similar to the saturation regime value. Note that this is in contrast to organic- and hybrid-based thin-film devices in which, generally, the linear regime mobility value is substantially smaller than the saturation regime value. As the discrepancy between these values is often sited to arise from trap states, the absence of a discrepancy in the current films likely atests to the high quality of the films.

Example 8

SnS$_{2-x}$Se$_x$ Films and Devices:

1. Light brown (N$_2$H$_5$)$_4$Sn$_2$S$_{6-x}$Se$_x$ crystals and powder are formed by dissolving (in a nitrogen atmosphere, over several hours, with stirring) 0.292 g of SnS$_2$ (1.6 mmol) and 0.147 g of SnSe$_2$ (0.53 mmol) in 2 ml of freshly distilled hydrazine and 0.128 g of S (4 mmol), yielding ultimately a yellow-brown solution.

Note that hydrazine is highly toxic and should be handled using appropriate protective equipment to prevent contact with either the vapors or liquid.

Evaporating the solution to dryness under flowing nitrogen gas over the period of several hours, as well as under vacuum for several hours, leads to the formation of approximately 0.628 g (0.49 mmol) of the product with expected approximate composition (N$_2$H$_5$)$_4$Sn$_2$S$_5$Se.

2. A solution of the hydrazinium-based precursor with approximate composition, (N$_2$H$_5$)$_4$Sn$_2$S$_5$Se, was formed by stirring 14 mg of the precursor and 3 mg S in 3.3 ml butylamine, in a nitrogen atmosphere, for approximately 2 hours. The resulting solution was clear brown in appearance and suitable for solution processing. Note that solutions have also been demonstrated using phenethylamine and ethylenediamine as the solvent.

3. Solution processing of the thin film was accomplished by spin coating. The 2 cm×2cm square silicon substrate was heavily n-doped, yielding a substrate resistivity <0.005 ohm-cm, and coated with approximately 2500 angstroms of thermally grown SiO$_2$. The substrate was cleaned using a standard process of a soap scrub with a cotton swab, sonication in ethanol and dichloromethane, and a piranha process (hydrogen peroxide:sulfuric acid in 1:4 volume ratio). Approximately 12 drops of the above-described butylamine-based solution (stage 2), passed through a 0.2 mm filter, were placed on the cleaned silicon substrate. The solution was allowed to sit on the substrate for approximately 10 sec before initiating the spinning cycle. The spinning cycle included of a ramp to 4000 rpm, 4000 rpm for 45 sec, and ramp to 0 rpm, yielding a film of the metal chalcogenide precursor. The film was further dried in air by placing the the substrate (with film on top) on a preheated hotplate at 120° C. for 5 minutes and then transferring the film into a nitrogen filled dry box for the final decomposition step.

4. The decomposition step was accomplished by placing the substrate (with the precursor film on top) on a preheated hot plate at 250° C. for a period of 20 minutes. The heating was performed in a nitrogen atmosphere with oxygen and water levels maintained below 1 ppm. After the heat treatment, the film was removed from the hot plate and cooled to ambient temperature, yielding a semiconducting film of SnS$_{2-x}$Se$_x$, with expected composition of approximately SnS$_{1.5}$Se$_{0.5}$.

TFT Device:

A thin film transistor was demonstrated by depositing gold source and drain electrodes on top of the semiconducting film that was prepared as described in stage 4. A representative plot of drain current, I$_D$, versus drain voltage, V$_D$, is shown in FIG. 18 as a function of the applied gate voltage, V$_G$, for a TFT with a SnS$_{2-x}$Se$_x$ channel formed using the stages 1-4 described above. The device operates as an n-channel transistor, operating in accumulation mode upon application of a positive gate bias. Application of a negative gate bias depletes the channel of electrons and shuts the device off. At low V$_D$, the TFT shows typical transistor behavior as I$_D$ increases linearly with V$_D$. Current saturation, with a small ohmic component, is observed at high V$_D$ as the accumulation layer is pinched off near the drain electrode. Current modulation (I$_{ON}$/I$_{OFF}$) and saturation regime field-effect mobility ($\mu_{sat}$) are calculated from the plot of I$_D$ and I$_D^{1/2}$ versus V$_G$ (FIG. 19), yielding I$_{ON}$/I$_{OFF}$=10$^4$ and $\mu_{sat}$=1.1 cm$^2$/V-s, respectively, for a −60 to 85 V gate sweep and V$_D$=85 V. Note that use of a thinner or higher dielectric constant gate insulator (relative to the 2500 Å SiO$_2$ layer currently used) is expected to enable significant reduction in the device operating voltage. The linear regime mobility derived from the plots in FIG. 18, $\mu_{lin}$=1.1 cm$^2$/V-s, virtually the same as the saturation regime value.

Example 9

Hydrazinium precursors of the following main group metal chalcogenides have also been isolated. They can be used, as in the examples above, to yield thin films suitable for device applications: SnSe$_2$, GeSe$_2$, In$_2$Se$_3$, Sb$_2$S$_3$, and Sb$_2$Se$_3$.

The described solution-processing technique is potentially valuable because of the ultrathin and relatively uniform nature of the resulting spin-coated films (i.e., ~50 angstroms, or less than 10 unit cells thick). This therefore opens the possibility of using the spin-coating process to fabricate multilayered structures. For example, layers of SnS$_2$ might alternate with layers of SnSe$_2$.

It might be advantageous to alternate large band gap semiconductors (or insulators) with narrow band gap semiconductors to create quantum well structures or semiconductors with different band offset to create type 1 or type 2 quantum well structures. By changing the concentration of solute in the solution or the spin speed, the relative thickness of the layers of the structure can be controlled. The resulting multilayer structures might be useful for device application in solar cells, thermoelectric or transistor devices.

The potential advantage of this process is that it would be much lower cost than the traditional MBE or vacuum evaporation approaches currently used for creating multilayer structures.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A hydrazinium-metal chalgenide represented by the formula:

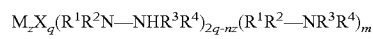

wherein:

M is a main-group metal having a valence n, wherein n is an integer from 1 to 6;

X is a chalcogen;

z is an integer from 1 to 10;

q is an integer from 1 to 30;

m is from 1 to 30.5; and each of $R^1$, $R^2$, $R^3$ and $R^4$ is independently selected from the group consisting of: hydrogen, aryl, methyl, ethyl and a linear; branched or cyclic alkyl of 3-6 carbon atoms.

2. The hydrazinium-metal chalgenide of claim 1, wherein said metal is selected from the group consisting of: Ge, Sn, Pb, Sb, Bi, Ga, In and Tl.

3. The hydrazinium-metal chalgenide of claim 1, wherein said chalcogenide is selected from the group consisting of: S, Se and Te.

4. The hydrazinium-metal chalgenide of claim 2, wherein said chalcogenide is selected from the group consisting of: S, Se and Te.

5. The hydrazinium-metal chalgenide of claim 1, wherein said metal chalcogenide is represented by the formula MX or $MX_2$ wherein M is a metal selected from the group consisting of: Ge, Sn, Pb and a combination thereof; and wherein X is a chalcogen selected from the group consisting of S, Se, Te and a combination thereof.

6. The hydrazinium-metal chalgenide of claim 1, wherein said metal chalcogenide-is represented by the formula $M_2X_3$ wherein M is a metal selected from the group consisting of: Sb, Bi, Ga, In and a combination thereof; and wherein X is a chalcogen selected from the group consisting of: S, Se, Te and a combination thereof.

7. The hydrazinium-metal chalgenide of claim 1, wherein said metal chalcogenide is represented by the formula $M_2X$ wherein M is Tl; and wherein X is a chalcogen selected from the group consisting of: S, Se, Te and a combination thereof.

8. The hydrazinium-metal chalgenide of claim 1, wherein said metal is selected, from the group consisting of: Sn and Sb; and wherein said chalcogen is selected from the group consisting of: S and Se.

9. The hydrazinium-metal chalgenide of claim 1, wherein said chalcogenide is represented by the formula: $Sn(S_{2-x}Se_x)$ wherein x is from 0 to 2.

10. The hydrazinium-metal chalgenide of claim 1, wherein each of $R^1$, $R^2$, $R^3$ and $R^4$ is independently selected from the group consisting of: hydrogen, aryl, methyl and ethyl.

11. The hydrazinium-metal chalgenide of claim 1, wherein $R^1$, $R^2$, $R^3$ and $R^4$ are hydrogen.

12. The hydrazinium-metal chalgenide of claim 2, wherein said chalcogenide is represented by the formula: $Sn(S_{2-x}Se_x)$ wherein x is from 0 to 2.

13. The hydrazinium-metal chalgenide of claim 2, wherein each of $R^1$, $R^2$, $R^3$ and $R^4$ is independently selected from the group consisting of: hydrogen, aryl, methyl and ethyl.

14. The hydrazinium-metal chalgenide of claim 2, wherein $R^1$, $R^2$, $R^3$ and $R^4$ are hydrogen.

15. The hydrazinium-metal chalgenide of claim 3, wherein each of $R^1$, $R^2$, $R^3$ and $R^4$ is independently selected from the group consisting of: hydrogen, aryl, methyl and ethyl.

16. The hydrazinium-metal chalgenide of claim 3, wherein $R^1$, $R^2$, $R^3$ and $R^4$ are hydrogen.

17. A hydrazinium metal chalcogenide prepared by a process comprising:

contacting: at least one metal chalcogenide and a salt of an amine compound with $H_2S$, $H_2Se$ or $H_2Te$, wherein said amine compound is represented by the formula:

$$NR^5R^6R^7$$

wherein each of $R^5$, $R^6$ and $R^7$ is independently selected from the group consisting of: hydrogen, aryl, methyl, ethyl and a linear, branched or cyclic alkyl of 3-6 carbon atoms, to produce an ammonium-based precursor of said metal chalcogenide;

contacting said ammonium-based precursor of said metal chalcogenide, a hydrazine compound represented by the formula:

$$R^1R^2N\text{—}NR^3R^4$$

wherein each of $R^1$, $R^2$, $R^3$ and $R^4$ is independently selected from the group consisting of: hydrogen, aryl, methyl, ethyl and a linear, branched or cyclic alkyl of 3-6 carbon atoms, and optionally, an elemental chalcogen selected from the group consisting of: S, Se, Te and a combination thereof; to produce a solution of a hydrazinium-based precursor of said metal chalcogenide in said hydrazine compound; and isolating hydrazinium-based precursor of said metal chalcogenide as a substantially pure product.

18. The hydrazinium-metal chalgenide of claim 17, wherein each of $R^1$, $R^2$, $R^3$ and $R^4$ is independently selected from the group consisting of hydrogen, aryl, methyl and ethyl.

* * * * *